(12) United States Patent
Okada et al.

(10) Patent No.: US 12,310,006 B2
(45) Date of Patent: May 20, 2025

(54) SEMICONDUCTOR DEVICE, SEMICONDUCTOR STORAGE DEVICE, AND METHOD OF MANUFACTURING SEMICONDUCTOR DEVICE

(71) Applicant: KIOXIA CORPORATION, Tokyo (JP)

(72) Inventors: Nobuaki Okada, Kawasaki Kanagawa (JP); Tetsuaki Utsumi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 363 days.

(21) Appl. No.: 17/548,085

(22) Filed: Dec. 10, 2021

(65) Prior Publication Data
US 2022/0399349 A1 Dec. 15, 2022

(30) Foreign Application Priority Data
Jun. 15, 2021 (JP) ................. 2021-099736

(51) Int. Cl.
*H01L 25/065* (2023.01)
*H10B 10/00* (2023.01)
*H10B 12/00* (2023.01)

(52) U.S. Cl.
CPC ......... *H10B 12/50* (2023.02); *H01L 25/0655* (2013.01); *H10B 10/18* (2023.02)

(58) Field of Classification Search
CPC ........ H10B 12/50; H10B 10/18; H10B 41/27; H10B 41/35; H10B 41/40; H10B 41/41; H10B 41/43; H10B 41/44; H10B 41/46; H10B 43/27; H10B 43/40; H01L 25/0655; H01L 29/78; H01L 29/4238; H01L 29/66477; G11C 11/406; G11C 16/0483; G11C 16/08; G11C 16/24; G11C 16/26; G11C 2211/5642; G11C 8/14

(Continued)

(56) References Cited

U.S. PATENT DOCUMENTS 8,395,922 B2 * 3/2013 Noguchi ................ G11C 5/025
365/63
9,412,878 B2 * 8/2016 Ogata ............... H01L 29/42344
(Continued)

FOREIGN PATENT DOCUMENTS

| JP | 2020-27865 A | 2/2020 |
| JP | 2021-145058 A | 9/2021 |
| TW | 201826500 A | 7/2018 |

*Primary Examiner* — Ori Nadav
(74) *Attorney, Agent, or Firm* — Finnegan, Henderson Farabow, Garrett & Dunner, LLP

(57) ABSTRACT

According to one embodiment, a semiconductor device includes a semiconductor layer, an element region provided on the semiconductor layer convexly, having a predetermined width in a first direction along a surface of the semiconductor layer, and extending in a second direction along the surface of the semiconductor layer and intersecting the first direction, a gate electrode arranged above the element region, a liner layer covering the gate electrode, and an element separation portion extends in the second direction on both sides of the element region in the first direction, and the liner layer continuously extends from the gate electrode to the element separation portion and the liner layer in the element separation portion lies below the element separation portion.

18 Claims, 20 Drawing Sheets

(58) Field of Classification Search
USPC .......................................................... 257/213
See application file for complete search history.

(56) References Cited

U.S. PATENT DOCUMENTS

| | | | |
|---|---|---|---|
| 9,548,310 B2* | 1/2017 | Kaneko | H10B 41/35 |
| 10,043,814 B2* | 8/2018 | Yamashita | H01L 29/42344 |
| 10,211,213 B2* | 2/2019 | Mihara | H10B 43/00 |
| 10,217,759 B2 | 2/2019 | Tsukuda et al. | |
| 10,411,139 B2* | 9/2019 | Yamashita | H01L 29/665 |
| 10,439,032 B2* | 10/2019 | Yoshitomi | H01L 29/42372 |
| 10,644,017 B2* | 5/2020 | Yamashita | H01L 29/513 |
| 10,818,679 B2* | 10/2020 | Hisamoto | H10B 41/48 |
| 11,069,617 B2* | 7/2021 | Matsuura | H01L 23/5226 |
| 2011/0227162 A1* | 9/2011 | Lin | H01L 29/7851 |
| | | | 438/296 |
| 2015/0263105 A1* | 9/2015 | Kusunoki | H01L 29/42324 |
| | | | 257/314 |
| 2018/0097007 A1 | 4/2018 | Tsukuda et al. | |
| 2020/0051908 A1 | 2/2020 | Matsuura | |
| 2021/0288017 A1* | 9/2021 | Suzuki | H01L 23/49827 |

* cited by examiner

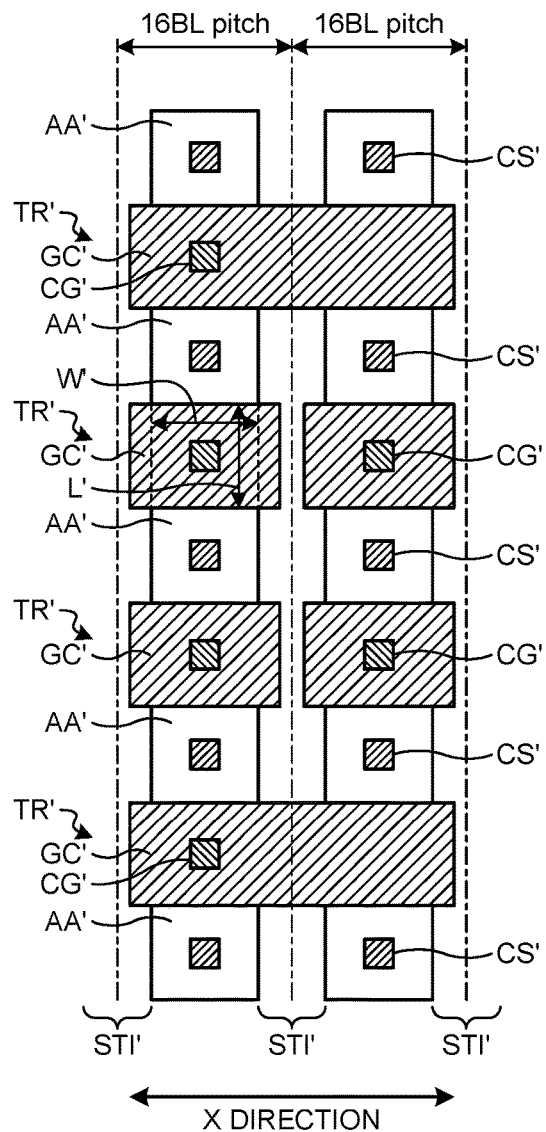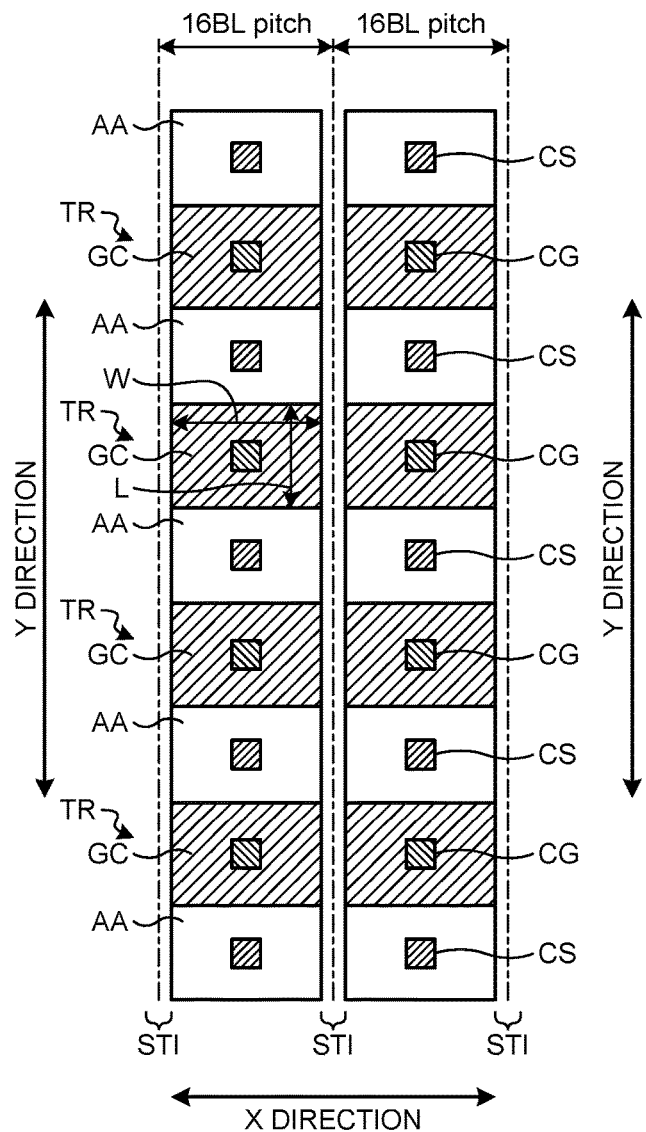

SEMICONDUCTOR DEVICE, SEMICONDUCTOR STORAGE DEVICE, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2021-099736, filed on Jun. 15, 2021; the entire contents of which are incorporated herein by reference.

FIELD

Embodiments described herein relate generally to a semiconductor device, a semiconductor storage device, and a method of manufacturing the semiconductor device.

BACKGROUND

A semiconductor device such as CMOS transistors includes, for example, an element region and a gate electrode arranged on the element region. In the semiconductor device manufacturing process, the gate electrode is formed larger in width than the element region in some cases in consideration of reduction in the deviation in position of the gate electrode concerning the element region. This can be a factor that will hinder the miniaturization of the semiconductor device.

BRIEF DESCRIPTION OF THE DRAWINGS

FIGS. 12A and 12B are schematic diagrams illustrating an example of the layout of transistors included in semiconductor storage devices according to the first embodiment and a comparative example;

DETAILED DESCRIPTION

A semiconductor device of an embodiment includes a semiconductor layer, an element region provided on the semiconductor layer convexly, having a predetermined width in a first direction along a surface of the semiconductor layer, and extending in a second direction along the surface of the semiconductor layer and intersecting the first direction, a gate electrode arranged above the element region, a liner layer covering the gate electrode; and an element separation portion extends in the second direction on both sides of the element region in the first direction, and the liner layer continuously extends from the gate electrode to the element separation portion, and the liner layer in the element separation portion lies below the element separation portion.

The present invention is now described in detail below with reference to the drawings. Moreover, the present invention should not be construed as being limited to the following embodiments. In addition, components in the embodiments below include those that can be easily conceived by those skilled in the art or substantially the same.

First Embodiment

A first embodiment is now described in detail with reference to the drawings.

(Schematic Configuration of Semiconductor Storage Device)

Figure 1:
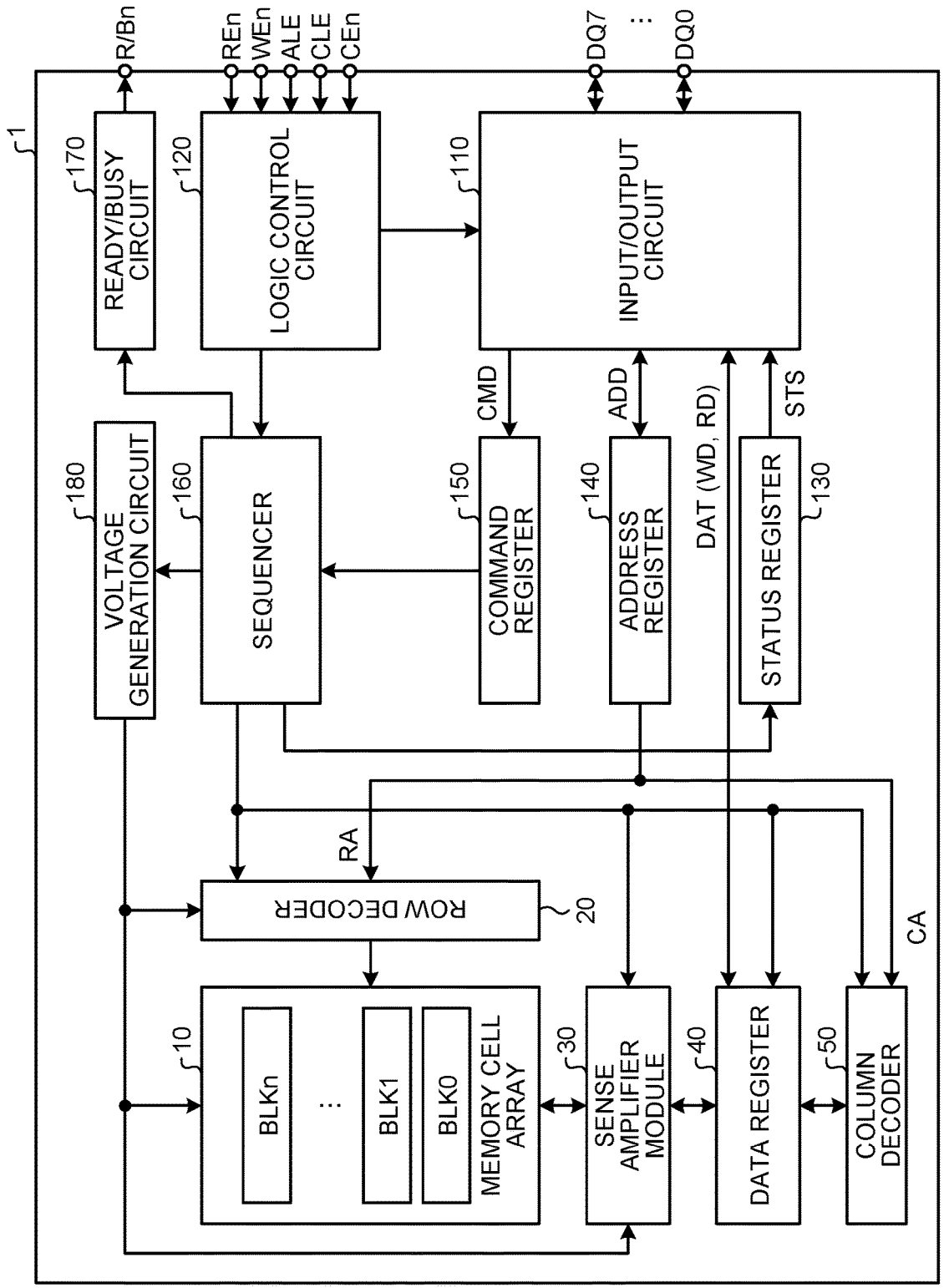
FIG. 1 is a block diagram of a semiconductor storage device according to a first embodiment.

FIG. 1 is a block diagram of a semiconductor storage device 1 according to the first embodiment. As illustrated in FIG. 1, the semiconductor storage device 1 includes an input/output circuit 110, a logic control circuit 120, a status register 130, an address register 140, a command register 150, a sequencer 160, a ready/busy circuit 170, a voltage generation circuit 180, a memory cell array 10, a row decoder 20, a sense amplifier module 30, a data register 40, and a column decoder 50.

The input/output circuit 110 controls the input/output of a signal DQ with an external device such as a memory controller (not illustrated) for controlling the semiconductor storage device 1. The input/output circuit 110 includes an input circuit and an output circuit, not illustrated.

The input circuit transmits data DAT such as write data WD received from an external device to the data register 40, transmits an address ADD to the address register 140, and transmits a command CMD to the command register 150.

The output circuit transmits status information STS received from the status register 130, data DAT such as read data RD received from the data register 40, and the address ADD received from the address register 140 to an external device.

The logic control circuit 120 receives, for example, a chip enable signal CEn, a command latch enable signal CLE, an address latch enable signal ALE, a write enable signal WEn, and a read enable signal REn from an external device. In addition, the logic control circuit 120 controls the input/output circuit 110 and the sequencer 160 on the basis of the received signal.

The status register 130 temporarily holds the status information STS in, for example, the write operation, the read operation, and the erase operation of data and gives notification of whether or not the operation is normally completed to an external device.

The address register 140 temporarily holds the address ADD received via the input/output circuit 110 from the external device. In addition, the address register 140 transfers a row address RA to the row decoder 20 and a column address CA to the column decoder 50.

The command register 150 temporarily holds the command CMD received via the input/output circuit 110 from the external device and transfers it to the sequencer 160.

The sequencer 160 controls the operation of the entire semiconductor storage device 1. More specifically, the sequencer 160 controls, for example, the status register 130, the ready/busy circuit 170, the voltage generation circuit 180, the row decoder 20, the sense amplifier module 30, the data register 40, the column decoder 50, and the like depending on the command CMD held by the command register 150 to execute a write operation, read operation, erase operation, and the like.

The ready/busy circuit 170 transmits a ready/busy signal R/Bn to an external device depending on the operating status of the sequencer 160.

The voltage generation circuit 180 generates a voltage necessary for the write, read, or erase operation under the control of the sequencer 160 and supplies, for example, the memory cell array 10, the row decoder 20, the sense amplifier module 30, or the like with the generated voltage. The row decoder 20 and the sense amplifier module 30 apply the voltage supplied from the voltage generation circuit 180 to memory cells in the memory cell array 10.

The memory cell array 10 includes a plurality of blocks BLK (BLK0 to BLKn), where n is an integer of 2 or more. The block BLK is a set of a plurality of memory cells associated with a bit line and a word line, and is, for example, a unit of quantity from which data is erased. The memory cell constitutes by, for example, a transistor and holds non-volatile data.

Such a memory cell having characteristics mentioned above causes the semiconductor storage device 1 to be configured as, for example, a NAND type non-volatile memory. However, the semiconductor storage device 1 can be configured as, for example, other types of non-volatile memory such as a NOR type.

The row decoder 20 decodes the row address RA. In addition, the row decoder 20 selects one of the blocks BLK on the basis of the decoded result. In addition, the row decoder 20 applies a necessary voltage to the block BLK.

The sense amplifier module 30 senses the data read from the memory cell array 10 upon the read operation. In addition, the sense amplifier module 30 transmits the read data RD to the data register 40. The sense amplifier module 30 transmits the write data WD to the memory cell array 10 upon the write operation.

The data register 40 includes a plurality of latch circuits. The latch circuit holds the write data WD and the read data RD. In one example, in the write operation, the data register 40 temporarily holds the write data WD received from the input/output circuit 110 and transmits it to the sense amplifier module 30. In addition, for example, in the read operation, the data register 40 temporarily holds the read data RD received from the sense amplifier module 30 and transmits it to the input/output circuit 110.

The column decoder 50 decodes the column address CA upon, for example, the write operation, the read operation, or the erase operation and selects a latch circuit in the data register 40 depending on the decoded result.

Moreover, each of the components in the semiconductor storage device 1 described above, excluding the memory cell array 10, is also referred to as a peripheral circuit. That is, the peripheral circuit includes the input/output circuit 110, the logic control circuit 120, the status register 130, the address register 140, the command register 150, the sequencer 160, the ready/busy circuit 170, the voltage generation circuit 180, the row decoder 20, the sense amplifier module 30, the data register 40, and the column decoder 50.

As described above, the semiconductor storage device 1 of the first embodiment is provided with the memory cell array 10 including a plurality of memory cells, and the peripheral circuit for driving the plurality of memory cells.

(Circuit Configuration of Memory Cell Array)

Figure 2:
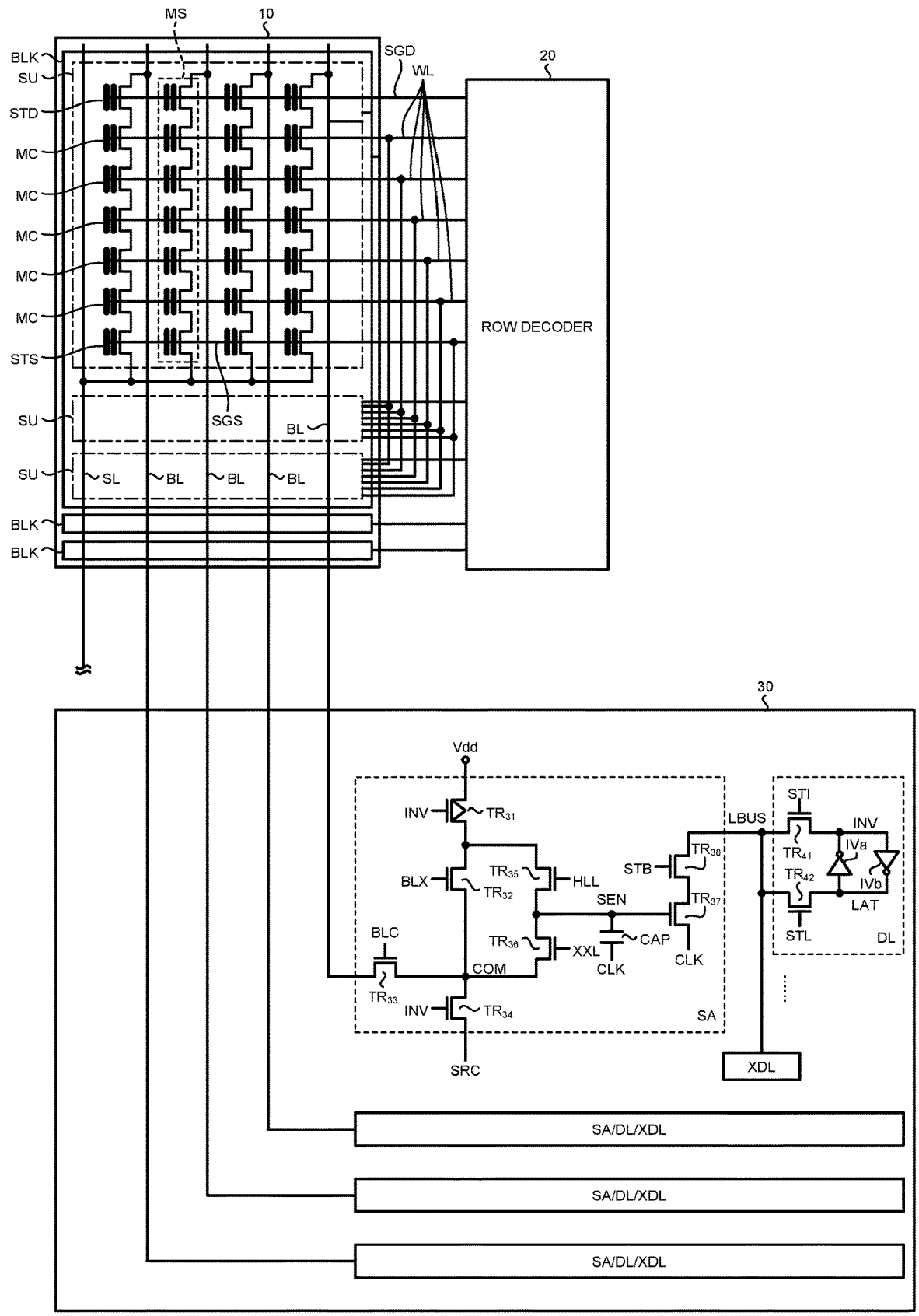
FIG. 2 is an equivalent circuit diagram illustrating an exemplary configuration of a memory cell array, a sense amplifier circuit, and a latch circuit included in the semiconductor storage device according to the first embodiment.

FIG. 2 is an equivalent circuit diagram illustrating an exemplary configuration of the memory cell array 10, a sense amplifier circuit SA, and latch circuits DL and XDL included in the semiconductor storage device 1 according to the first embodiment. The exemplary circuit configuration of the memory cell array 10 provided in the semiconductor storage device 1 is first described below.

The memory cell array 10 includes the plurality of blocks BLK as described above. Each of the plurality of blocks BLK includes a plurality of string units SU. Each of the plurality of string units SU includes a plurality of memory strings MS. Each of the plurality of memory strings MS has one end connected to the peripheral circuit such as the row decoder 20 and the sense amplifier module 30 via a bit line BL. Each of the plurality of memory strings MS has the other end connected to the peripheral circuit via a common source line SL.

The memory string MS includes a drain selection transistor STD, a plurality of memory cells MC, and a source selection transistor STS, which are connected in series between the bit line BL and the source line SL. In some cases, the drain selection transistor STD and the source selection transistor STS are simply referred hereinafter to as a selection transistor (STD or STS).

The memory cell MC is, for example, a field effect transistor (FET) including a charge storage layer in a gate insulating layer. The threshold voltage of the memory cell MC varies depending on the amount of charge in the charge storage layer. Setting one or a plurality of threshold voltages enables the memory cell MC to store one bit or a plurality of bits of data. A word line WL is connected to each of the gate electrodes of the plurality of memory cells MC corresponding to one memory string MS. Each of the word lines WL is commonly connected to all memory strings MS in one block BLK.

The selection transistor (STD or STS) is, for example, a field effect transistor. The selection transistors (STD and STS) have a gate electrode connected to selection gate lines (SGD and SGS), respectively. The drain selection line SGD connected to the drain selection transistor STD is provided in association with a string unit SU and is commonly connected to all the memory strings MS in one string unit SU. The source selection line SGS connected to the source selection transistor STS is commonly connected to all the memory strings MS in one block BLK.

(Configuration of Sense Amplifier Module)

An exemplary configuration of the sense amplifier module 30 is now described with reference to FIGS. 2 and 3.

The sense amplifier module 30 described above includes a plurality of sense amplifier circuits SA provided for each bit line BL. In one example, in the read operation, each sense amplifier circuit SA senses the data read from the corresponding bit line BL and determines whether the read data is "0" or "1".

Further, the data register 40 described above includes a plurality of latch circuits DL and XDL, each of which corresponds to the plurality of sense amplifier circuits SA. The latch circuit XDL is also provided for each bit line BL. On the other hand, the plurality of latch circuits DL is provided for the corresponding sense amplifier circuit SA. In this case, the number of latch circuits DL is designed on the basis of, for example, the number of data bits that one memory cell MC can hold. The latch circuits DL and XDL temporarily hold data related to the corresponding bit line BL.

An exemplary circuit configuration of the sense amplifier module 30 is now described with reference to FIG. 2. FIG. 2 illustrates one sense amplifier circuit SA in the sense amplifier module 30, and one latch circuit DL or XDL in the data register 40. Moreover, the sequencer 160 controls a plurality of control signals to be supplied to the sense amplifier circuit SA or the like.

As illustrated in FIG. 2, the sense amplifier circuit SA includes transistors $TR_{31}$ to $TR_{38}$ and a capacitor CAP. In the figure, the transistor $TR_{31}$ is a low-withstand voltage P-channel metal-oxide-semiconductor (MOS) transistor. In addition, the transistors $TR_{32}$ to $TR_{38}$ are low-withstand voltage N-channel MOS transistors. The transistors $TR_{31}$ to $TR_{38}$ included in the sense amplifier circuit SA can be simply referred to hereinafter as a transistor TR.

The transistor $TR_{31}$ has one end connected to a power supply line to which a power supply voltage Vdd is supplied, and the transistor $TR_{31}$ has a gate electrode connected to a node INV. The transistor $TR_{32}$ has one end connected to the other end of the transistor $TR_{31}$, the transistor $TR_{32}$ has the other end connected to a node COM, and the transistor $TR_{32}$ has a gate electrode to which a control signal BLX is input. The transistor $TR_{33}$ has one end connected to the node COM, the transistor $TR_{33}$ has the other end connected to the corresponding bit line BL, and the transistor $TR_{33}$ has a gate electrode to which a control signal BLC is input.

The transistor $TR_{34}$ has one end connected to the node COM, the transistor $TR_{34}$ has the other end connected to a node SRC, and the transistor $TR_{34}$ has a gate electrode connected to the node INV.

The transistor $TR_{35}$ has one end connected to the other end of the transistor $TR_{31}$, the transistor $TR_{35}$ has the other end connected to a node SEN, and the transistor $TR_{35}$ has a gate electrode to which a control signal HLL is input. The transistor $TR_{36}$ has one end connected to the node SEN, the transistor $TR_{36}$ has the other end connected to the node COM, and the transistor $TR_{36}$ has a gate electrode to which a control signal XXL is input.

The transistor $TR_{37}$ has one end to which a clock CLK is input, and the transistor $TR_{37}$ has a gate electrode connected to the node SEN. The transistor $TR_{38}$ has one end connected to the other end of the transistor $TR_{37}$, the transistor $TR_{38}$ has the other end connected to a bus LBUS, and the transistor $TR_{38}$ has a gate electrode to which a control signal STB is supplied. The capacitor CAP has one end connected to the node SEN, and the capacitor CAP has the other end to which the clock CLK is input.

The latch circuit DL includes inverters IVa and IVb and transistors $TR_{41}$ and $TR_{42}$. In this figure, the transistors $TR_{41}$ and $TR_{42}$ are low-withstand voltage N-channel MOS transistors. The transistors $TR_{41}$ and $TR_{42}$ included in the data register 40 are simply referred to hereinafter as a transistor TR in some cases.

Moreover, although one latch circuit DL is illustrated in FIG. 2, the data register 40 can include a plurality of latch circuits DL for one sense amplifier circuit SA as described above. The other latch circuit DL (not illustrated) has a configuration similar to the latch circuit DL of FIG. 2.

The inverter IVa has an input terminal connected to the node LAT and an output terminal connected to the node INV. The inverter IVb has an input terminal connected to the node INV and an output terminal connected to the node LAT.

The transistor $TR_{41}$ has one end connected to the node INV, the other end connected to the bus LBUS, and a gate electrode to which a control signal STI is input. The transistor $TR_{42}$ has one end connected to the node LAT, the other end connected to the bus LBUS, and a gate electrode to which a control signal STL is input.

The latch circuit XDL has a substantially similar configuration to the latch circuit DL. The latch circuit XDL is connected to the bus LBUS in such a way as to enable data transmission and reception with the sense amplifier circuit SA and the latch circuit DL. In addition, the latch circuit XDL is connected to the input/output circuit 110 described above and is used for data input/output between the sense amplifier circuit SA and the input/output circuit 110.

Further, the latch circuit XDL is also used for the cache operation of the semiconductor storage device 1. In other words, even if all the latch circuits DL corresponding to the sense amplifier circuit SA are in use, when the latch circuit XDL is free, the semiconductor storage device 1 is capable of receiving data from the outside.

As described above, the sense amplifier circuit SA and the latch circuits DL and XDL belonging to the peripheral circuits include a plurality of transistors TR.

The operation of the sense amplifier circuit SA having the configuration mentioned above is now briefly described.

As an example of writing data to the memory cell MC, in a case where electric charge is injected into the memory cell MC to raise a threshold value, an "H" level (data of "1") is stored in the node INV of the latch circuit DL. This turns the transistor $TR_{34}$ on, setting the bit line BL to 0V.

As another example of writing data to the memory cell MC, in a case where electric charge is not injected into the memory cell MC not to change a threshold value, an "L" level (data of "0") is stored in the node INV of the latch circuit DL. This turns the transistor $TR_{31}$ on, giving a predetermined positive voltage to the bit line BL.

The node INV is set to an "L" level upon readout, turning on the transistor $TR_{31}$. In addition, the bit line BL is pre-charged by the transistor $TR_{31}$ via the transistors $TR_{41}$ and $TR_{42}$. In addition, the transistor $TR_{35}$ is also turned on, and the node SEN is charged to a predetermined potential.

Then, the transistor $TR_{35}$ is turned off, a signal XXL is set to the "H" level, and the transistor $TR_{36}$ is turned on. Thus, if the corresponding memory cell MC is turned on, the potential of the node SEN is lowered, and the transistor $TR_{37}$ is turned off. On the other hand, if the corresponding memory cell MC is turned off, the potential of the node SEN remains at the "H" level, and the transistor $TR_{37}$ is turned on.

Further, the transistor $TR_{38}$ is turned on by the signal STB, and the potential corresponding to ON/OFF of the transistor $TR_{37}$ is read out to the bus LBUS and held in the latch circuit DL.

Moreover, the circuit configuration, interconnection mode, data transfer technique, and the like of the sense amplifier circuit SA and the latch circuits DL and XDL illustrated in FIG. 2 are illustrative examples. The sense amplifier circuit SA and the latch circuits DL and XDL can employ various types of configurations, interconnection modes, data transfer techniques, and the like in addition to the above. In this case, the number and types of transistors TR included in the sense amplifier circuit SA and the latch circuits DL and XDL can also be different. In one example, the sense amplifier circuit SA and the latch circuits DL and XDL can be configured as a high-withstand voltage P-channel MOS transistor, a high-withstand voltage N-channel MOS transistor, or the like.

Figure 3:
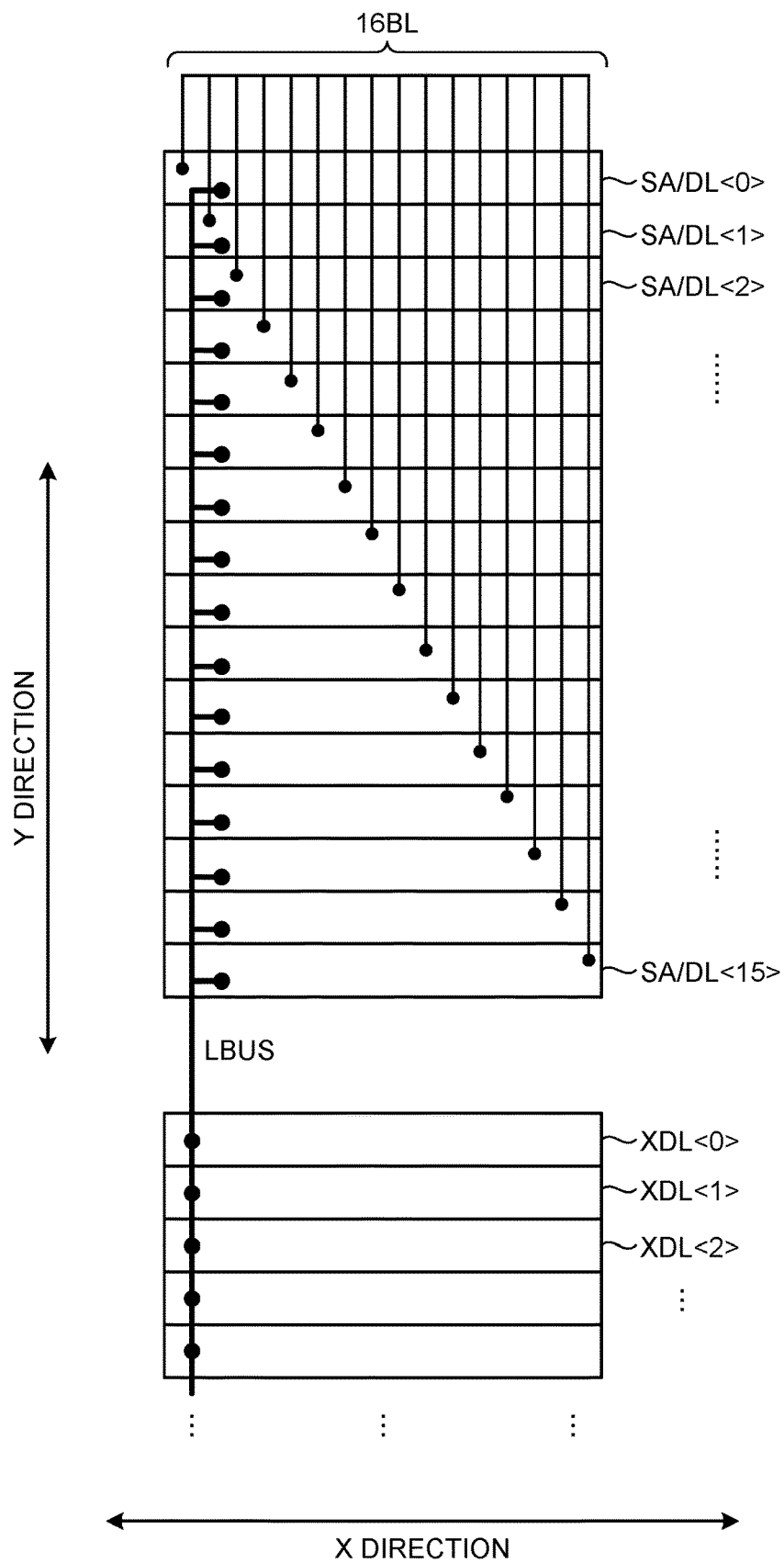
FIG. 3 is a schematic diagram illustrating an example of the layout of a sense amplifier module and a data register included in the semiconductor storage device according to the first embodiment.

FIG. 3 is a schematic diagram illustrating an example of the layout of the sense amplifier module 30 and the data register 40 included in the semiconductor storage device 1 according to the first embodiment. In FIG. 3, as one example, the sense amplifier circuit SA and the latch circuits DL and XDL are assumed to have the connection mode and data transfer technique of FIG. 2 described above.

The direction along the plurality of bit lines BL connected to each of the plurality of memory cells MC is herein defined as a Y direction as a second direction. In addition, the direction intersecting the X direction, that is, the direction along the plurality of word lines WL connected to each of the plurality of memory cells MC is defined as an X direction as a first direction.

As illustrated in FIG. 3, in the physical configuration of the semiconductor storage device 1, the plurality of latch circuits DL of the data register 40 are combined with one sense amplifier circuit SA of the sense amplifier module 30 via the bus LBUS described above, forming a plurality of sets SA/DL (SA/DL<0> to SA/DL<15>).

These sets SA/DL are grouped for each predetermined number of bit lines BL. In the example of FIG. 3, 16 sets SA/DL<0> to SA/DL<15> are grouped and arranged in a row in the Y direction along 16 bit lines BL.

The latch circuits XDL (XDL<0> to XDL<15>) of the data register 40 are also provided as a set of 16 pieces and are arranged in a row in the Y direction along the 16 bit lines BL, corresponding to sets SA/DL<0> to SA/DL<15> of the sense amplifier circuit SA and the latch circuit DL arranged in a row.

The set SA/DL formed of the sense amplifier circuit SA and the latch circuit DL, and the latch circuits XDL corresponding to the set are connected by the bus LBUS in such a way as to enable data transmission and reception to each other. In the example of FIG. 3, 16 sets SA/DL<0> to SA/DL<15> arranged in a row share one bus LBUS.

(Configuration of Transistor)

An exemplary physical configuration of the transistor TR as a semiconductor device included in the sense amplifier circuit SA and the latch circuits DL and XDL is now described with reference to FIGS. 4A to 5D.

Figure 4A:
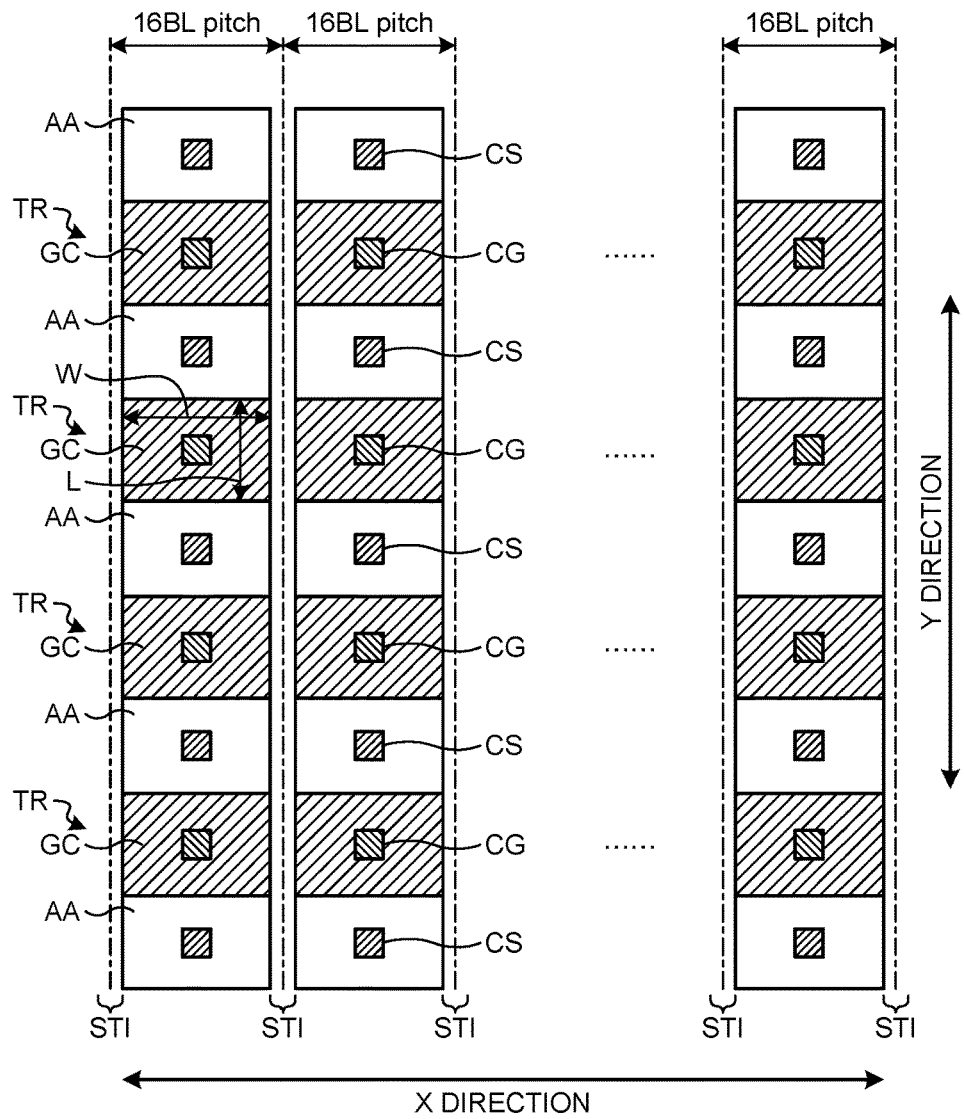
FIGS. 4A and 4B are schematic diagrams illustrating an example of the layout of transistors included in the semiconductor storage device according to the first embodiment.
Figure 4B:
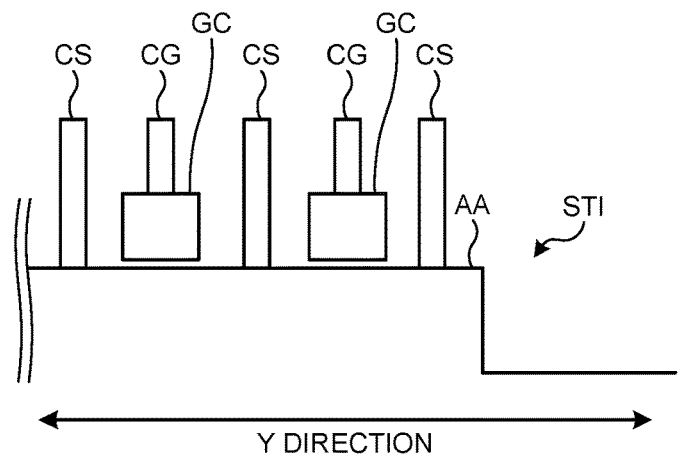

FIGS. 4A and 4B are schematic diagrams illustrating an example of the layout of transistor TR included in the semiconductor storage device 1 according to the first embodiment. FIG. 4A is a simplified top view of the plurality of transistors TR, and FIG. 4B is a simplified cross-sectional view of the plurality of transistors TR in the Y direction.

As illustrated in FIG. 4A, the transistors TR included in the sense amplifier circuit SA and the latch circuits DL and XDL arranged in one row are arranged in, for example, one row within the pitch of 16 bit lines BL. Each transistor TR includes an element region AA and a gate electrode GC arranged above the element region AA.

The element region AA has a channel at a position overlapping the gate electrode GC in the vertical direction and has a source/drain region on both sides of the channel in the Y direction. However, the transistors TR arranged in a row share the source/drain region with the transistors TR adjacent to each other in the Y direction along the bit line BL.

FIG. 4A illustrates an example in which four transistors TR are arranged in a row in the Y direction and share the source/drain region with each other. However, the number of transistors TR that share the source/drain region with each other is not limited to four and is optional.

Further, an element separation portion STI is provided between the element regions AA of the transistors TR adjacent to each other in the X direction.

Moreover, the width of the element region AA in the Y direction should be as wide as possible. Still, the width of the element separation portion STI is as narrow as possible. This is to lengthen a gate width W of the transistor TR, preventing or reducing the fluctuation in threshold values due to the narrow channel effect (NCE) and the reverse narrow channel effect.

The gate width of the transistor narrows by the narrow channel effect, causing the threshold value to rise. Thus, the on-current is smaller than the effect of narrowing the gate width. On the other hand, the gate width of the transistor narrows by the reverse narrow channel effect, causing the leakage current flowing under the channel to increase even if the transistor channel is closed at a predetermined voltage. Such fluctuation in threshold values is also caused by the short-channel effect due to the narrowing of the transistor gate length ("L" in FIG. 4A). The threshold variation between adjacent transistors typically depends on $1/\sqrt{LW}$ (where L indicates the gate length and W indicates the gate width). The sense amplifiers and the data latches are provided in each bit line, so the number thereof is large. Thus, it is desirable that this threshold variation is small from the viewpoint of stability of the read operation.

A gate contact CG connected to an upper layer wiring or the like (not illustrated) is connected to the gate electrode GC of the transistor TR. A source/drain contact CS connected to an upper layer wiring or the like (not illustrated) is connected to the element region AA. The transistors TR arranged in a row in the Y direction share the source/drain contact CS with the transistors TR adjacent in the Y direction in a similar way to sharing the source/drain region.

Moreover, the same control signal input to the gate electrode GC is input to some of the plurality of transistors TR. In such a case, the gate electrodes GC of the transistors TR are electrically connected by, for example, upper layer wiring (not illustrated). As described above, the gate electrodes GC included in the plurality of transistors TR of the sense amplifier circuit SA and the latch circuits DL and XDL are physically separated individually at the level of the layers constituting the gate electrode GC (a gate electrode layer GCr described later) even if a common control signal is supplied.

FIG. 4B illustrates how the plurality of transistors TR shares the source/drain region and the source/drain contact CS in the Y direction, and the gate electrodes GC of the plurality of transistors TR are individually separated. As illustrated in FIG. 4B, the transistors TR arranged in a row in the Y direction share the source/drain region and the source/drain contact CS among the plurality of transistors TR, except for the transistor TR at the end in the Y direction. In addition, the element separation portion STI is arranged on one side in the Y direction of the transistor TR at the end in the Y direction.

Figure 5A:
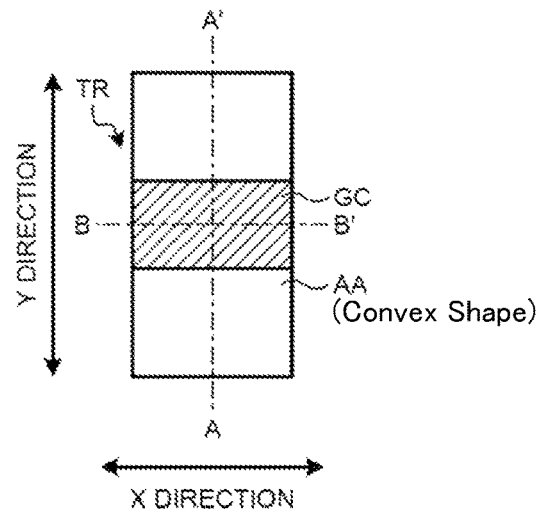
FIGS. 5A to 5D are diagrams illustrating an exemplary configuration of a transistor applied to the semiconductor storage device according to the first embodiment.
Figure 5B:
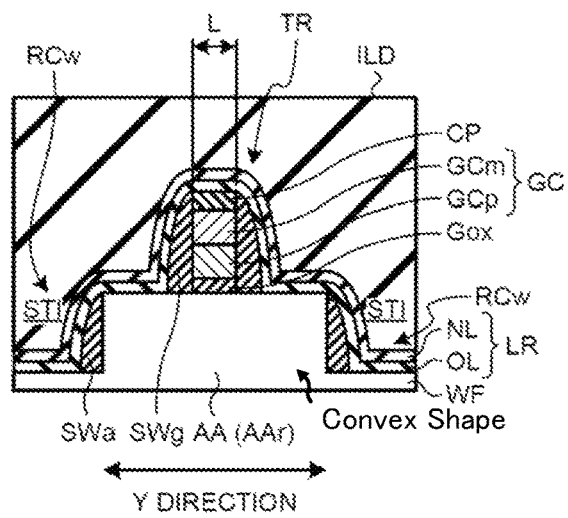
Figure 5C:
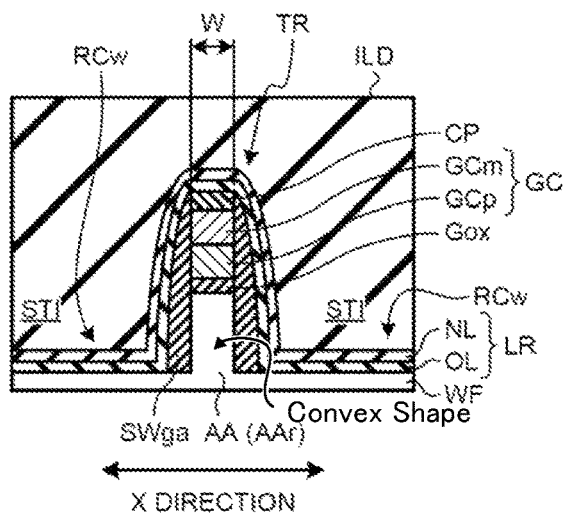
Figure 5D:
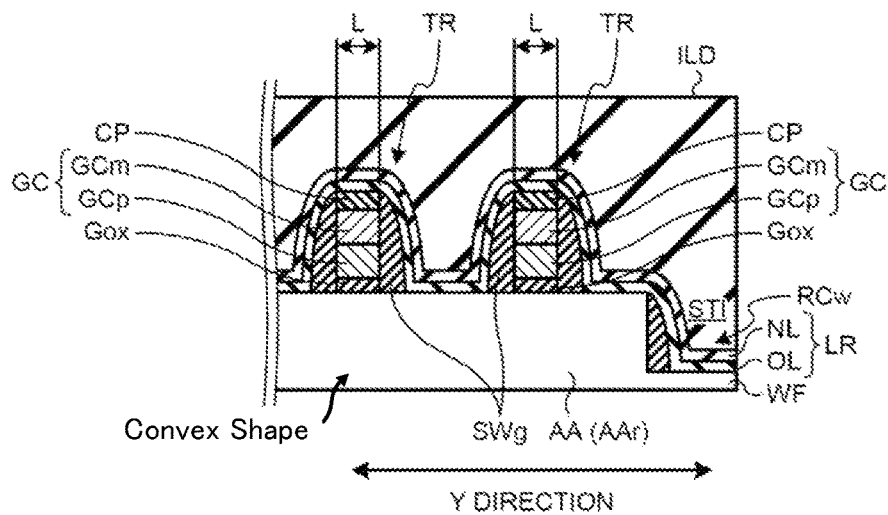

FIGS. 5A to 5D are diagrams illustrating an exemplary configuration of the transistor TR applied to the semiconductor storage device 1 according to the first embodiment. FIG. 5A is a schematic top view illustrating the gate electrode GC of the transistor TR and the element region AA. FIG. 5B is a cross-sectional view of the transistor TR in the Y direction, that is, the A-A' line of FIG. 5A. FIG. 5C is a cross-sectional view of the transistor TR in the X direction, that is, the B-B' line of FIG. 5A. FIG. 5D is a cross-sectional view of the plurality of transistors TR in the direction along the Y direction. In FIGS. 5A to 5D, the gate contact CG and the source/drain contact CS are omitted.

Moreover, FIGS. 5A to 5C illustrate one transistor TR configured independently as an example of the transistor TR applicable to the semiconductor storage device 1. However, as described above, in the case where the plurality of transistors TR is arranged in a row to share the source/drain region with each other, the element separation portions STI are not arranged on both sides of the transistors TR excluding both ends of the arrangement in a cross-section along the Y direction, as illustrated in FIG. 5D. In addition, the element separation portion STI is arranged on only one side of the transistors TR at both ends of the arrangement.

As illustrated in FIGS. 5A to 5C, the transistor TR of the first embodiment includes a substrate WF, the element region AA, the gate electrode GC, sidewalls SWg, SWa, and SWga, and a liner layer LR.

The substrate WF is a semiconductor substrate such as a silicon material. The substrate WF has a well AAr formed on the substrate WF from the surface of the substrate WF to a predetermined depth. The well AAr is a layer including impurities such as arsenic, phosphorus, or boron. The selection is made for impurities that are suitable for the transistor TR depending on whether the transistor TR is an N-channel type or a P-channel type.

The element region AA has a predetermined width in the X direction and is configured in a convex shape extending in the Y direction. Specifically, the element region AA has a configuration in which the surface of the substrate WF on which the well AAr is formed is processed into a convex shape.

A pair of element separation portions STI is arranged in a recess RCw depressed from the surface of the substrate WF on both sides of the element region AA in the X direction and both sides in the Y direction, respectively. In other words, the element separation portion STI is arranged around the single transistor TR configured independently to surround the transistor TR.

The element separation portion STI is constituted by an interlayer insulating layer ILD such as a silicon oxide layer filled in the recess RCw. This enables the element separation portion STI to electrically separate the individual transistors TR in the X and Y directions.

A gate insulating layer Gox is arranged on the element region AA at a position where it overlaps with the gate electrode GC as viewed from the top. The gate insulating layer Gox is, for example, a silicon oxide layer or a high-k layer composed of hafnium oxide, zirconium oxide, or the like.

The gate electrode GC is arranged above the element region AA via the gate insulating layer Gox. More specifically, a poly-gate electrode GCp is arranged on the gate insulating layer Gox, and a metal-gate electrode GCm is arranged on the poly-gate electrode GCp. The poly-gate electrode GCp is a conductive polysilicon layer doped with P-type or N-type impurities. The metal-gate electrode GCm is a metal layer composed of tungsten, tungsten silicide, nickel silicide, or the like.

As described above, the gate electrode GC is configured as, for example, a polymetal gate electrode in which a poly-gate electrode GCp and a metal-gate electrode GCm are combined.

A cap layer CP is arranged on the gate electrode GC. The cap layer CP is, for example, a silicon nitride layer, a silicon oxide layer, or the like.

Moreover, as illustrated in FIG. 5B, the gate insulating layer Gox, the poly-gate electrode GCp, the metal-gate electrode GCm, and the cap layer CP have substantially the same width in the Y direction, and their center positions in the Y direction substantially coincide. In other words, the gate insulating layer Gox and the cap layer CP have a width substantially equal to the gate length L of the gate electrode GC.

Further, both side surfaces in the Y direction of each of the gate insulating layer Gox, the poly-gate electrode GCp, the metal-gate electrode GCm, and the cap layer CP are located on substantially the same plane. In other words, the end positions of the gate insulating layer Gox, the poly-gate electrode GCp, the metal-gate electrode GCm, and the cap layer CP in the Y direction substantially overlap when viewed from the stacking direction.

Their widths are substantially equal, and their center positions and end positions in the Y direction substantially coincide. This means herein that the widths of the gate insulating layer Gox, the poly-gate electrode GCp, the metal-gate electrode GCm, and the cap layer CP are equal within the processing variation, and their center positions and end positions in the Y direction coincide.

Further, the protruding upper surface of the element region AA, the gate insulating layer Gox, the poly-gate electrode GCp, the metal-gate electrode GCm, and the cap layer CP have substantially the same width in the X direction, and their center positions in the X direction substantially coincide, as illustrated in FIG. 5C. In other words, the upper surface of the element region AA, the gate insulating layer Gox, and the cap layer CP have a width substantially equal to a gate width W of the gate electrode GC.

Further, both side surfaces in the X direction of each of the element region AA, the gate insulating layer Gox, the poly-gate electrode GCp, the metal-gate electrode GCm, and the cap layer CP are located on substantially the same plane. In other words, the end positions of the element region AA, the gate insulating layer Gox, the poly-gate electrode GCp, the metal-gate electrode GCm, and the cap layer CP in the X direction substantially overlap when viewed from the stacking direction.

Their widths are substantially equal, and their center positions and end positions in the X direction substantially coincide. This means herein that the widths of the upper surface of the element region AA, the gate insulating layer Gox, the poly-gate electrode GCp, the metal-gate electrode GCm, and the cap layer CP are equal within the processing variation, and their center positions and end positions in the X direction coincide.

The sidewall SWg functioning as a first sidewall covers the side surfaces of the gate insulating layer Gox, the poly-gate electrode GCp, the metal-gate electrode GCm, and the cap layer CP facing in the Y direction. The sidewall SWa functioning as a second sidewall covers the side surface of the element region AA facing the Y direction.

On the other hand, the sidewall SWga functions as the first and second sidewalls in which the sidewall SWg covering the side surface of the gate insulating layer Gox, the poly-gate electrode GCp, the metal-gate electrode GCm, and the cap layer CP and the sidewall SWa covering the side surface of the element region AA are integrated in the X direction. The sidewall SWga covers the respective side surfaces of the element region AA, the gate insulating layer Gox, the poly-gate electrode GCp, the metal-gate electrode GCm, and the cap layer CP.

The sidewalls SWg, SWa, and SWga are, for example, a silicon oxide layer or the like.

The liner layer LR has, for example, a multilayer structure in which a silicon oxide layer OL and a silicon nitride layer NL are stacked in this order. The liner layer LR covers the cap layer CP, the gate electrode GC, the gate insulating layer Gox, and the element region AA protruding from the substrate WF.

More specifically, the liner layer LR extends from the upper surface of the cap layer CP to the side surface of the cap layer CP, the gate electrode GC, and the gate insulating layer Gox. In addition, the liner layer LR covers the side surfaces of the cap layer CP, the gate electrode GC, and the gate insulating layer Gox through the sidewall SWg or the sidewall SWga.

Further, the liner layer LR continuously extends from the gate electrode GC to the element separation portion STI. In the element separation portion STI, the liner layer LR lies concealed below the element separation portion STI. In other words, the liner layer LR lies concealed below the interlayer insulating layer ILD filled in the recess RCw of the substrate WF. The liner layer LR continuously covers the bottom surface of the recess RCw from the side surface of the gate electrode GC.

The transistor TR including the gate electrode GC is covered with the interlayer insulating layer ILD. The interlayer insulating layer ILD is also filled in the recesses RCw on both sides of the element region AA in the X direction and both sides in the Y direction, constituting the element separation portion STI, as described above. In other words, the interlayer insulating layer ILD that covers the transistor TR and the element separation layer STI that electrically separates the individual transistors TR are integrally formed. The liner layer LR is interposed between the element separation layer STI formed of the interlayer insulating layer ILD and the recess RCw of the substrate WF. The interlayer insulating layer ILD is, for example, a non-doped silicate glass (NSG) layer or the like.

As described above, the transistor TR of the first embodiment is configured as, for example, an N-channel or P-channel MOS transistor. The sense amplifier module 30 described above includes, for example, a complementary MOS (CMOS) MOS transistor and the like.

(Method of Manufacturing Transistor)

A method of manufacturing the transistor TR of the first embodiment is now described with reference to FIGS. 6A to 11Cb. The transistor TR is manufactured by using an imprint technique for transferring a pattern to a resist layer or the like using a template on which the pattern is formed. A template used for manufacturing the transistor TR is described below.

Figure 6A:
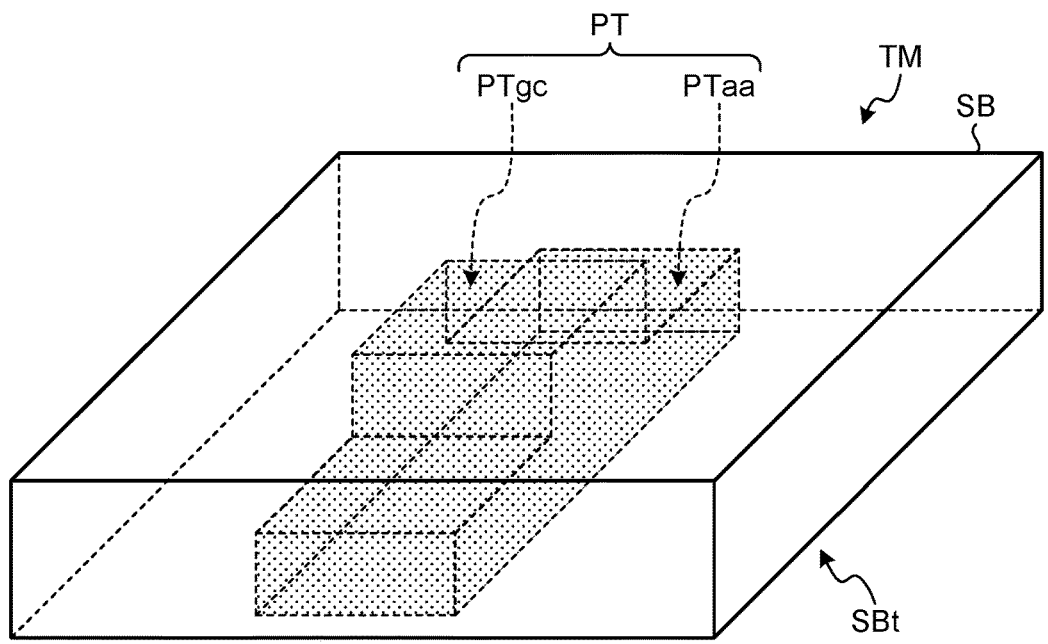
FIGS. 6A and 6B are diagrams illustrating an exemplary configuration of a template used for manufacturing the transistor according to the first embodiment.
Figure 6B:
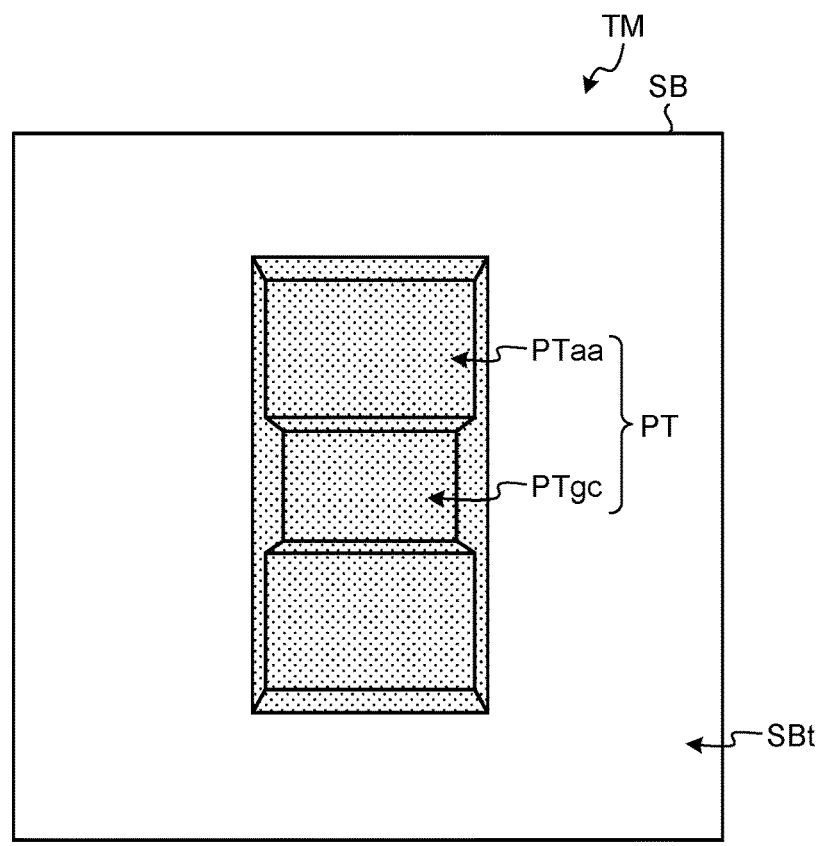

FIGS. 6A and 6B are diagrams illustrating an exemplary configuration of a template TM used for manufacturing the transistor TR according to the first embodiment. FIG. 6A is an oblique perspective view of the template TM, and FIG. 6B is a top view of the template TM as viewed from the side of a transfer surface SBt.

As illustrated in FIGS. 6A and 6B, the template TM has a transparent substrate SB and a pattern PT. The transparent substrate SB is, for example, a quartz substrate or the like that transmits ultraviolet rays or the like. The transparent substrate SB includes the transfer surface SBt provided with the pattern PT. The pattern PT is transferred to the substrate WF described above to form the shape of the transistor TR. Thus, the pattern PT has an element region pattern PTaa and a gate electrode pattern PTgc. The element region pattern PTaa is transferred to the substrate WF and forms the element region AA. The gate electrode pattern PTgc forms the gate electrode GC.

The element region pattern PTaa is a groove-like pattern having an opening in the transfer surface SBt of the transparent substrate SB and reaching a predetermined depth from the transfer surface SBt to the transparent substrate SB. In other words, the element region pattern PTaa has a concave shape obtained by reversing the shape of the convex element region AA. Thus, in FIG. 6B, the element region pattern PTaa is recessed toward the deep side of the figure.

The gate electrode pattern PTgc is arranged at a position overlapping the element region pattern PTaa and reaches a predetermined depth from a depth that the element region pattern PTaa reaches. In other words, the gate electrode pattern PTgc has a concave shape obtained by reversing the shape of the gate electrode GC protruding from the element region AA. Thus, in FIG. 6B, the gate electrode pattern PTgc is further recessed toward the deep side of the figure from the element region pattern PTaa recessed toward the deep side of the figure.

The width of the element region pattern PTaa and the width of the gate electrode pattern PTgc are substantially equal to each other in the short-length direction of the element region pattern PTaa extending in a predetermined direction. The substantially equal widths mean herein that the widths are equal within the range of processing variation of the element region pattern PTaa and the gate electrode pattern PTgc.

Moreover, in the examples of FIGS. 6A and 6B, only one gate electrode pattern PTgc and only one element region pattern PTaa are illustrated. However, in the imprint technique, the substrate WF in the wafer state is partitioned into predetermined regions called a shot region, and the template TM is pressed against each shot region to transfer the pattern PT. Thus, one template TM has the same number of patterns PT as the number of element regions AA and the number of gate electrodes GC formed in the shot region.

FIGS. 7A to 7D are diagrams illustrating an example of the procedure of a method of manufacturing the template TM according to the first embodiment. FIG. 7 illustrates an oblique perspective view of the substrate SB with the transfer surface SBt heading upward.

Figure 7A:
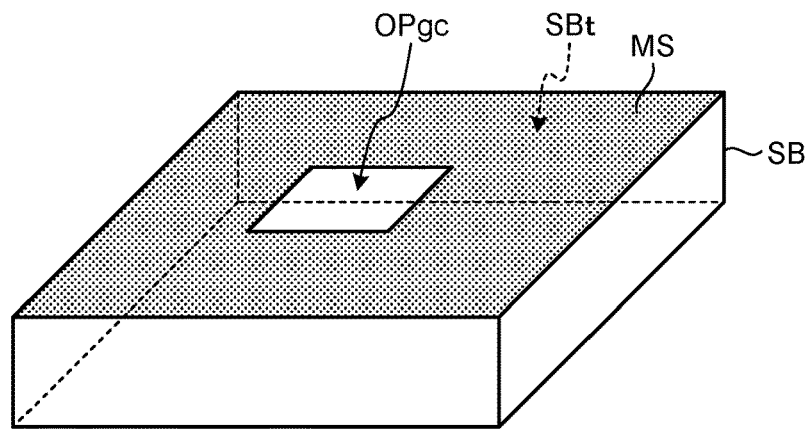
FIGS. 7A to 7D are diagrams illustrating an example of the procedure of a method of manufacturing the template according to the first embodiment.

As illustrated in FIG. 7A, a mask layer MS such as a cobalt layer is formed on the transfer surface SBt of the substrate SB. In addition, an opening OPgc is formed at the position where the gate electrode pattern PTgc is formed in the mask layer MS. The opening OPgc is formed by lithography-printing using, for example, an electron beam.

Figure 7B:
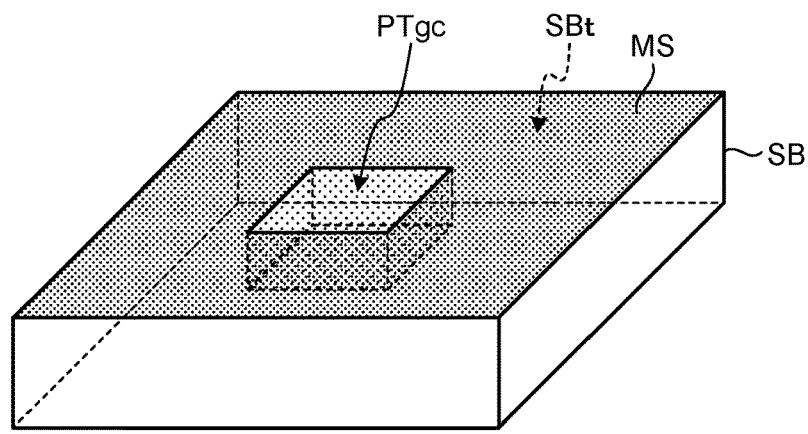

As illustrated in FIG. 7B, the transfer surface SBt of the substrate SB exposed from the mask layer MS is processed to form the gate electrode pattern PTgc having an opening on the transfer surface SBt.

Figure 7C:
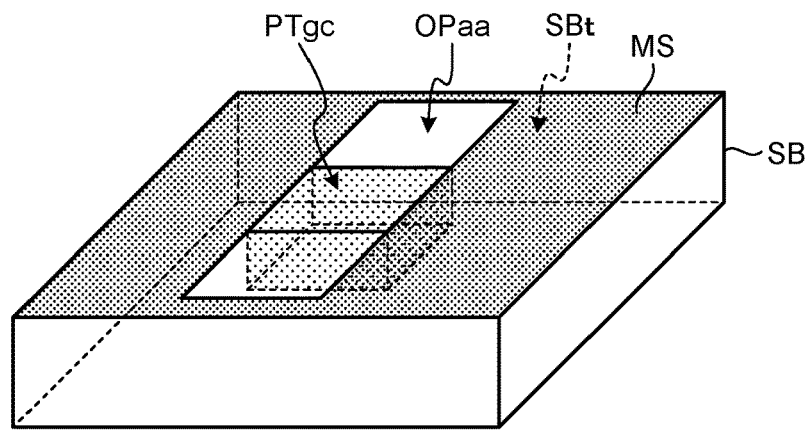

As illustrated in FIG. 7C, an opening OPaa is formed at the position where the element region pattern PTaa is formed in the mask layer MS. The opening OPaa is formed by lithography-printing using, for example, an electron beam or the like.

Figure 7D:
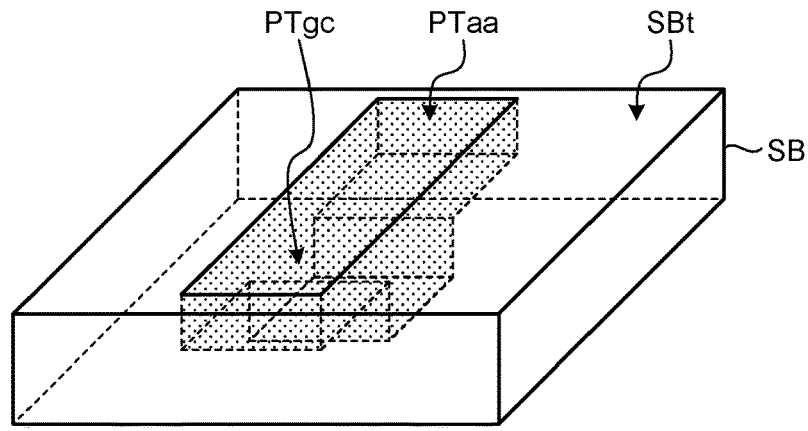

As illustrated in FIG. 7D, the portion exposed from the mask layer MS in the substrate SB is processed to form the element region pattern PTaa having an opening in the transfer surface SBt. In this event, the gate electrode pattern PTgc having an opening in the transfer surface SBt is recessed deeper to be the gate electrode pattern PTgc further recessed from the bottom surface of the element region pattern PTaa.

In this way, the template TM of the first embodiment is manufactured.

The method of manufacturing the transistor TR using the template TM described above is now described. Moreover, the transistor TR is manufactured as part of the manufacturing process of the semiconductor storage device 1 of the first embodiment.

Figure 8A:
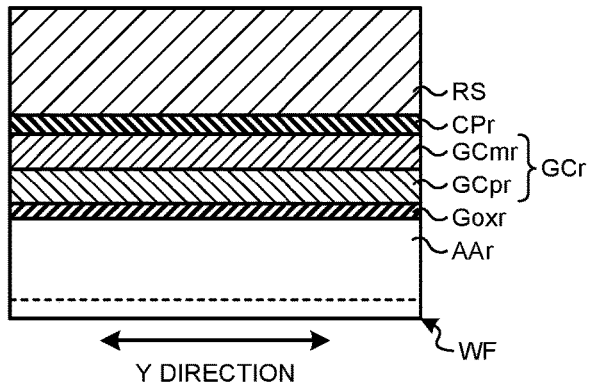
FIGS. 8Aa to 8Cb are diagrams illustrating an example of the procedure of a method of manufacturing the transistor according to the first embodiment.
Figure 8A:
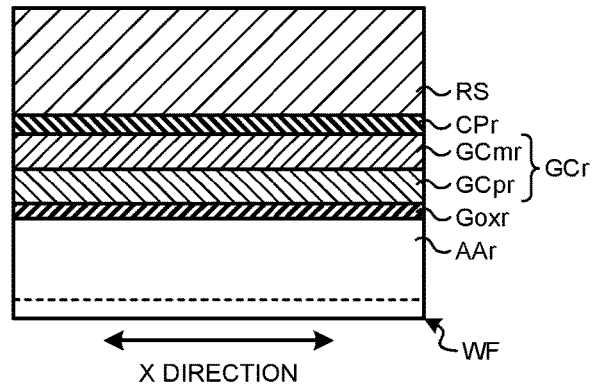

FIGS. 8Aa to 11Cb are diagrams illustrating an example of the procedure of a method of manufacturing the transistor TR according to the first embodiment. In FIGS. 8Aa to 11Cb, the figures in which the lowercase letter "a" is attached to the drawing number are cross-sectional views taken along the Y direction of the substrate WF, and the figures in which the lowercase letter "b" is attached to the drawing number are cross-sectional views taken along the X direction of the substrate WF.

As illustrated in FIGS. 8Aa and 8Ab, the well AAr extending from the surface of the substrate WF to a predetermined depth is formed on the substrate WF. The well AAr is formed by injecting impurities such as arsenic, phosphorus, or boron into the substrate WF, which is a semiconductor substrate such as a silicon substrate, to a predetermined depth.

Further, a gate electrode layer GCr and a resist layer RS are formed in this order above the well AAr via a gate insulating layer Goxr. More specifically, the gate insulating layer Goxr covering the entire surface of the well AAr is formed. In addition, a poly-gate electrode layer GCpr covering the entire surface of the gate insulating layer Goxr is formed, and the poly-gate electrode layer GCpr is appropriately doped with P-type or N-type impurities. In addition, a metal-gate electrode layer GCmr covering the entire surface of the poly-gate electrode layer GCpr is formed, and a cap layer CPr covering the entire surface of the metal-gate electrode layer GCmr is formed. In addition, the resist layer RS that covers the entire surface of the cap layer CPr is formed.

The resist layer RS functioning as a mask layer is, for example, a photocurable resist layer that is cured by irradiating it with ultraviolet rays or the like.

Moreover, the gate insulating layer Goxr, the poly-gate electrode layer GCpr, the metal-gate electrode layer GCmr, and the cap layer CPr can be formed using, for example, the chemical vapor deposition (CVD) technique or the like.

Further, the resist layer RS can be formed by using, for example, the spin coating technique or the like. However, regardless of the examples of FIGS. 8Aa and 8Ab, the resist material can be dropped in the form of droplets for each shot region by using, for example, the inkjet technique or the like.

Figure 8B:
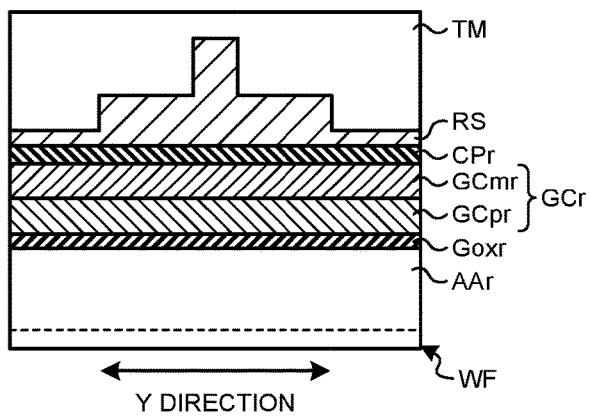
Figure 8B:
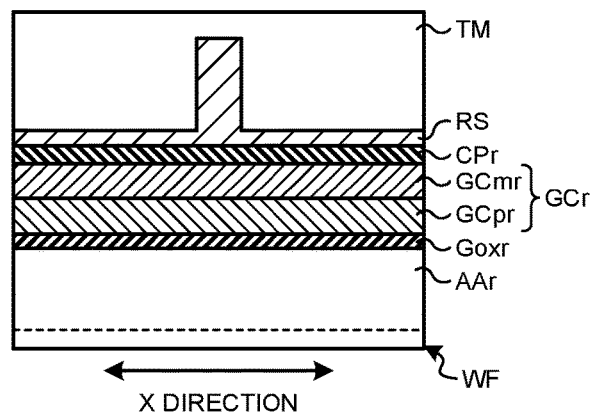

As illustrated in FIGS. 8Ba to 8Cb, an element region pattern RSpa and a gate electrode pattern RSpg are transferred to the resist layer RS by pressing the pattern PT of the template TM described above against the resist layer RS.

More specifically, as illustrated in FIGS. 8Ba and 8Bb, the template TM is pressed against the resist layer RS with the transfer surface SBt of the template TM facing the resist layer RS on the substrate WF in such a way that the extending direction of the element region pattern PTaa of the template TM coincides with the Y direction of the substrate WF. In this event, a gap remains between the uppermost cap layer CPr of the substrate WF and the template TM in such a way that the substrate WF and various configurations on the substrate WF keep from coming into contact with the template TM.

Figure 8C:
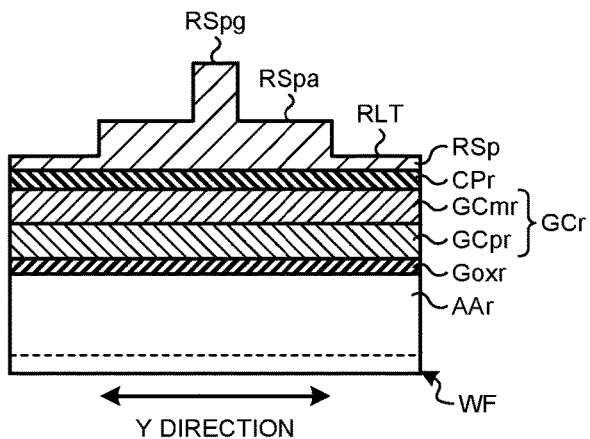
Figure 8C:
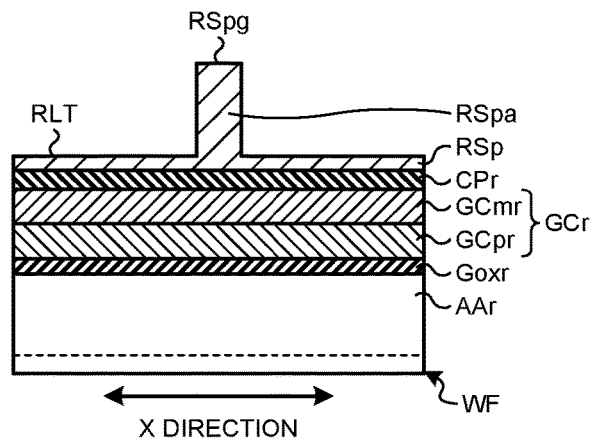

As illustrated in FIGS. 8Ca and 8Cb, the resist layer RS is irradiated with ultraviolet rays or the like through the template TM to cure the resist layer RS with the template TM pressed against the resist layer RS. In addition, the template TM is released from the cured resist layer RS.

This creates a resist pattern RSp to which the element region pattern RSpa and the gate electrode pattern RSpg are transferred. The resist pattern RSp functioning as a mask pattern has the element region pattern RSpa and the gate electrode pattern RSpg.

The element region pattern RSpa is a pattern to which the element region pattern PTaa of the template TM is transferred. Thus, the element region pattern RSpa has a predetermined width in the X direction and has a convex shape extending in the Y direction. In addition, the gate electrode pattern RSpg is a pattern to which the gate electrode pattern PTgc of the template TM is transferred. Thus, the gate electrode pattern RSpg has a convex shape arranged on the upper surface of the element region pattern RSpa.

Further, the resist pattern RSp has a resist residual layer RLT in which the resist layer RS in the gap between the cap layer CPr and the template TM is cured.

Figure 9A:
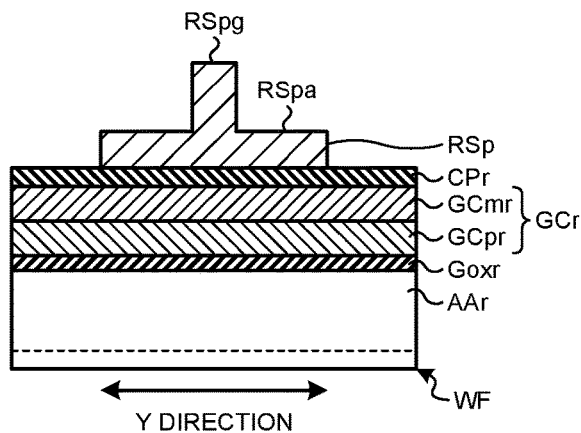
FIGS. 9Aa to 9Cb are diagrams illustrating an example of the procedure of a method of manufacturing the transistor according to the first embodiment.
Figure 9A:
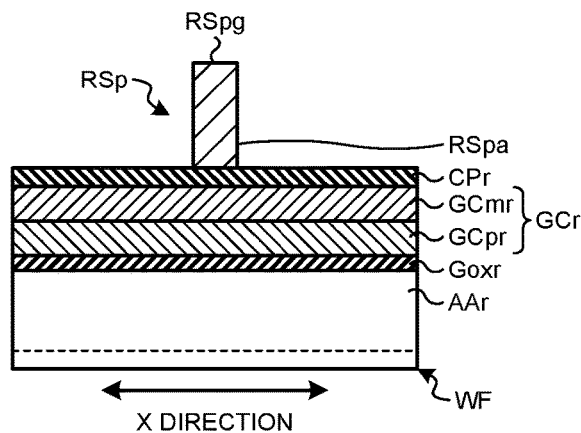

As illustrated in FIGS. 9Aa and 9Ab, the resist pattern RSp is treated with oxygen plasma or the like to remove the resist residual layer RLT. This causes the cap layer CPr other than the formation position of the element region AA to be exposed.

Figure 9B:
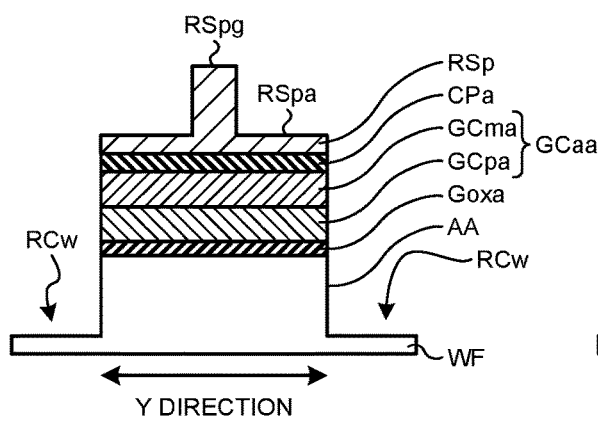
Figure 9B:
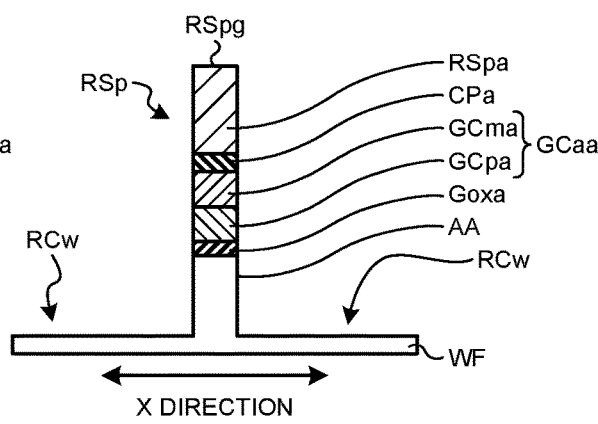

As illustrated in FIGS. 9Ba and 9Bb, the element region pattern RSpa is transferred to the gate electrode layer GCr and the well AAr using the resist pattern RSp, forming the element region AA having a predetermined width in the X direction and having a convex shape extending in the Y direction.

More specifically, the cap layer CPr, the metal-gate electrode layer GCmr, the poly-gate electrode layer GCpr, the gate insulating layer Goxr, and the well AAr of the portion exposed from the resist pattern RSp are sequentially processed. These processing steps can be performed, for example, by using the reactive ion etching (RIE) technique or the like. In this event, the processing time and the like are controlled so that the well AAr is processed to the desired depth.

This forms the element region AA in which the well AAr is processed. However, in this event, the source/drain region of the element region AA is not formed yet. In addition, the recess RCw is formed in the substrate WF by digging around the element region AA. In addition, a cap layer CPa having a shape substantially overlapping with the element region AA in the stacking direction of the respective layers is formed. A gate electrode layer GCaa including the metal-gate electrode layer GCma and the poly-gate electrode layer GCpa is formed. A gate insulating layer Goxa is formed.

The shape in which these components substantially overlap with the element region AA means herein that the cap layer CPa, the metal-gate electrode layer GCma, the poly-gate electrode layer GCpa, and the gate insulating layer Goxa have a shape that overlaps with the element region AA within the range of processing variation.

Figure 9C:
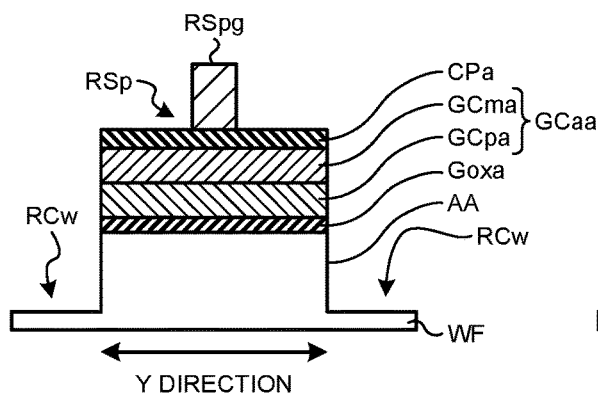
Figure 9C:
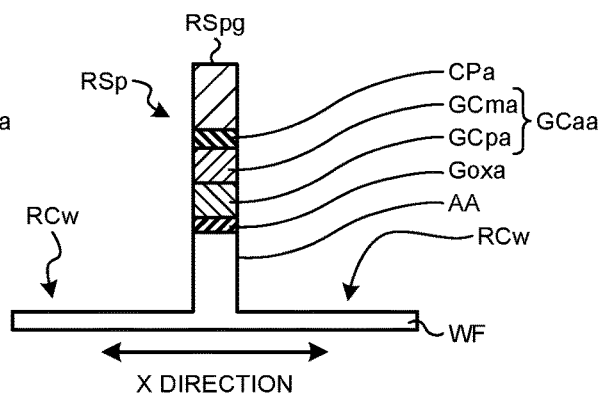

As illustrated in FIGS. 9Ca and 9Cb, the resist pattern RSp is treated with oxygen plasma or the like to remove the remaining element region pattern RSpa. This exposes the cap layer CPa other than the formation position of the gate electrode GC.

Figure 10A:
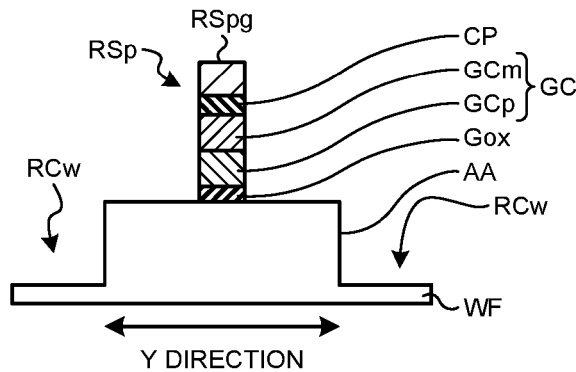
FIGS. 10Aa to 10Cb are diagrams illustrating an example of the procedure of a method of manufacturing the transistor according to the first embodiment.
Figure 10A:
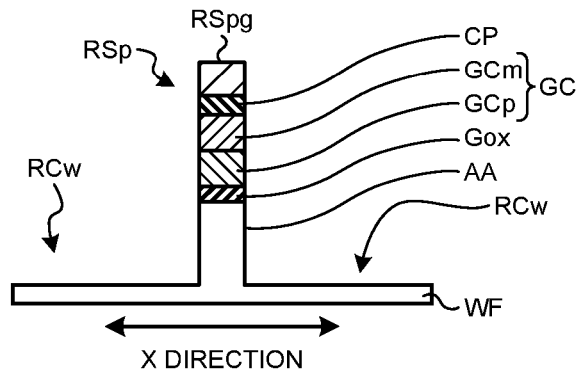

As illustrated in FIGS. 10Aa and 10Ab, the gate electrode pattern RSpg is transferred to the gate electrode layer GCaa using the resist pattern RSp, forming the gate electrode GC arranged above the element region AA via the gate insulating layer Gox.

More specifically, the cap layer CPa, the metal-gate electrode layer GCma, the poly-gate electrode layer GCpa, and the gate insulating layer Goxa of the portion exposed from the resist pattern RSp are sequentially processed. The processing described above can be performed by using, for example, the RIE technique or the like similar to the above-described way. In this event, the processing performed while maintaining the selection ratio to the well AAr makes it possible to prevent or reduce the upper surface of the element region AA and the lower surface of the recess RCw from being processed.

Accordingly, the cap layer CP, the gate electrode GC, and the gate insulating layer Gox are formed above the element region AA. They have the width in the X direction substantially equal to the width of the element region AA and have the center position in the X direction that substantially coincides with the center position of the element region AA.

The fact that the widths of the components are substantially equal to that of the element region AA and their center positions substantially coincide with that of the element region AA means herein that the cap layer CP, the gate electrode GC, and the gate insulation layer Gox have the width equal to that of the element region AA within the range of the processing variation and have the center position corresponding to that of the element region AA within the range of the processing variation.

Moreover, due to processing variations, in some cases, side etching occurs in at least a part of the cap layer CP, the gate electrode GC, and the gate insulating layer Gox, and at least one of the dimensions in the X direction and the Y direction is reduced. In addition, due to the processing variation, in some cases, at least a part of the apex corner portion of the cap layer CP, the gate electrode GC, and the gate insulating layer Gox having a rectangle shape in the top view has a rounded rounding shape.

Figure 10B:
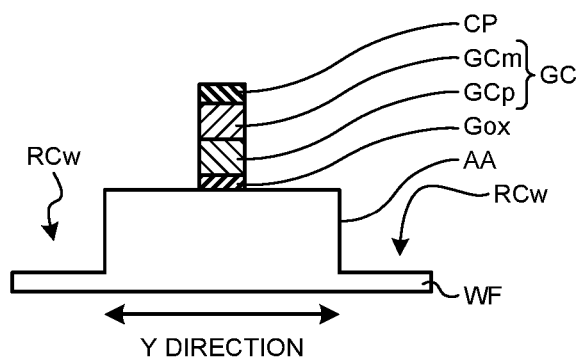
Figure 10B:
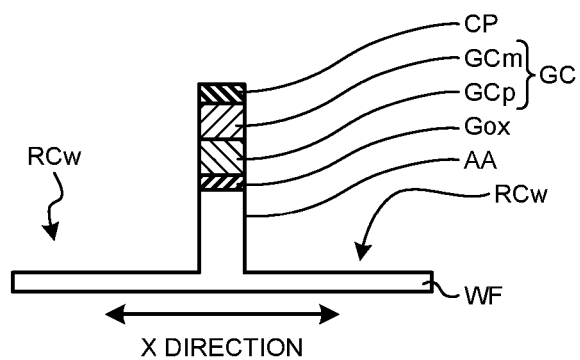

As illustrated in FIGS. 10Ba and 10Bb, the remaining resist pattern RSp is removed by asking using oxygen plasma or the like.

Further, a diffusion layer in which impurities such as arsenic, phosphorus, or boron are diffused at a low concentration is formed in the element region AA. Any of these impurities is inhibited from diffusing by the cap layer CP, the gate electrode GC, and the gate insulating layer Gox and does not diffuse directly under the gate insulating layer Gox.

Figure 10C:
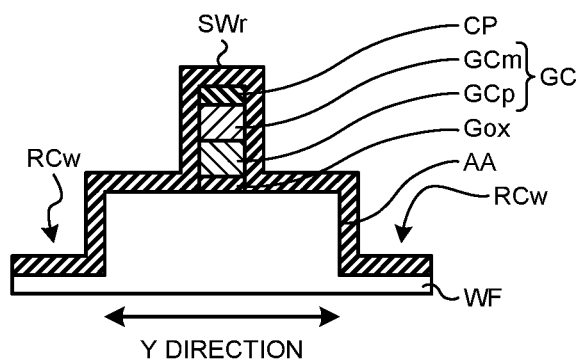
Figure 10C:
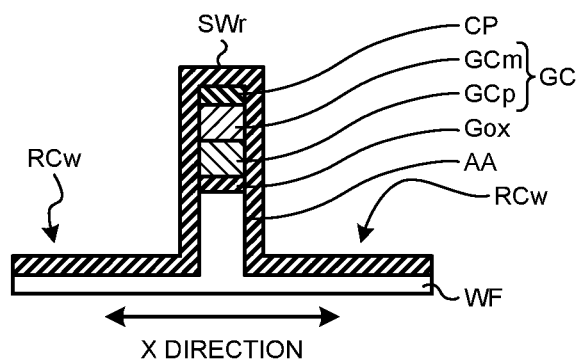

As illustrated in FIGS. 10Ca and 10Cb, a sidewall layer SWr such as a silicon oxide layer is formed on the entire surface of the substrate WF including the gate electrode GC and the like. This enables the sidewall layer SWr to continuously cover the upper and side surfaces of the cap layer CP, the side surface of the gate electrode GC, the side surface of the gate insulating layer Gox, the upper and side surfaces of the element region AA, and the bottom surface of the recess RCw.

Figure 11A:
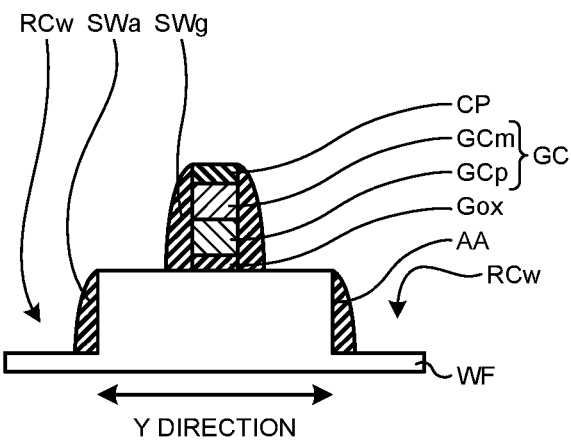
FIGS. 11Aa to 11Cb are diagrams illustrating an example of the procedure of a method of manufacturing the transistor according to the first embodiment.
Figure 11A:
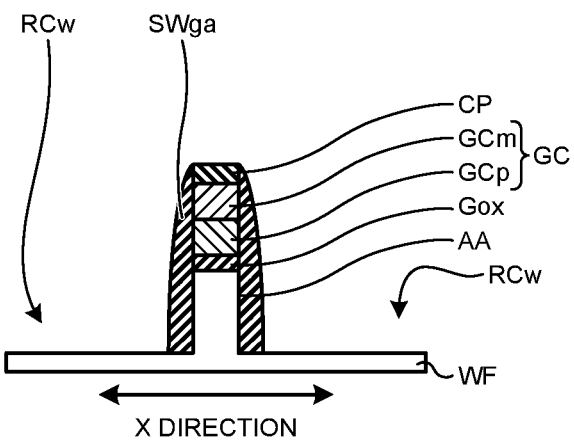

As illustrated in FIGS. 11Aa and 11Ab, the sidewall layer SWr is entirely etched back using, for example, the RIE technique or the like. In this event, the sidewall layer SWr is removed from the upper surface of the cap layer CP, the upper surface of the element region AA, and the bottom surface of the recess RCw by performing the etching under the condition that anisotropy can be obtained. On the other hand, the sidewall layer SWr remains on the side surfaces of the cap layer CP, the gate electrode GC, the gate insulating layer Gox, and the element region AA.

Accordingly, the sidewall SWg is formed on the side surfaces of the cap layer CP, the gate electrode GC, and the gate insulating layer Gox facing in the Y direction. In addition, the sidewall SWa is formed on the side surface of the element region AA facing the Y direction. In addition, the sidewall SWga is formed on the side surfaces of the cap layer CP, the gate electrode GC, the gate insulating layer Gox, and the element region AA facing the X direction.

After the sidewalls SWg, SWa, and SWga are formed, a diffusion layer in which impurities such as arsenic, phosphorus, or boron are diffused at a high concentration is formed in the element region AA. Any of these impurities is inhibited from diffusing by the cap layer CP, the gate electrode GC, and the gate insulating layer Gox including the sidewalls SWg, SWa, and SWga, so it does not diffuse directly under the gate insulating layer Gox.

Accordingly, a source/drain region in which impurities are diffused at a high concentration is formed in the element region AA on both sides of the cap layer CP, the gate electrode GC, and the gate insulating layer Gox. In addition, the element region AA directly under the gate insulating layer Gox functions as a channel. Moreover, the type of impurity is determined depending on whether the N-channel type or P-channel type transistor TR is formed.

Figure 11B:
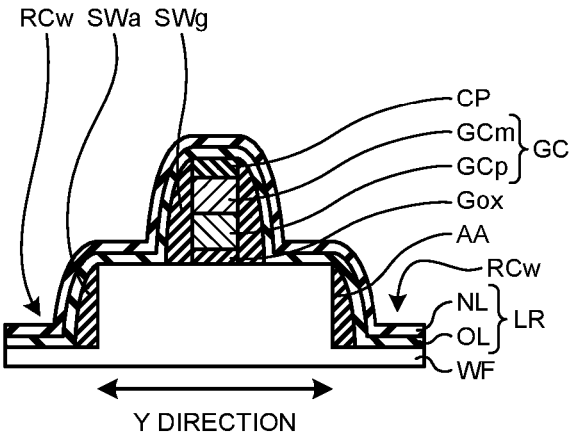
Figure 11B:
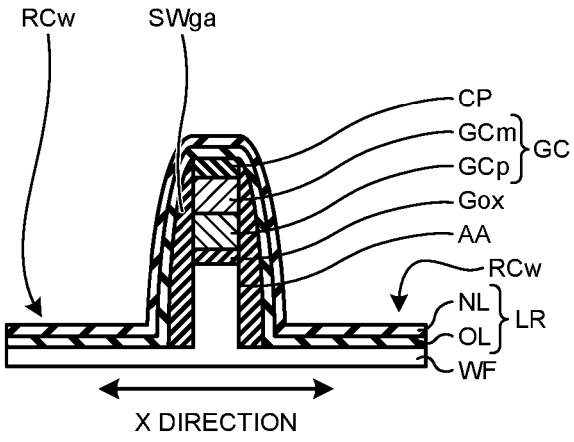

As illustrated in FIGS. 11Ba and 11Bb, the liner layer LR covering the gate electrode GC and the element region AA is formed. In this event, the recesses RCw on both sides of the element region AA in the X direction and both sides in the Y direction are also continuously covered with the liner layer LR from the upper surface of the element region AA.

More specifically, for example, the silicon oxide layer OL and the silicon nitride layer NL are stacked in this order on the entire surface of the substrate WF including the gate electrode GC and the like. This enables the silicon oxide layer OL and the silicon nitride layer NL to continuously cover the upper and side surfaces of the cap layer CP, the side surface of the gate electrode GC, the side surface of the gate insulating layer Gox, the upper and side surfaces of the element region AA, and the bottom surface of the recess RCw.

Moreover, the sidewall SWg or the sidewall SWga is interposed between the liner layer LR on each side surface of the cap layer CP, the gate electrode GC, and the gate insulating layer Gox. In addition, the sidewall SWa or the sidewall SWga is interposed between the liner layer LR on the side surface of the element region AA.

Figure 11C:
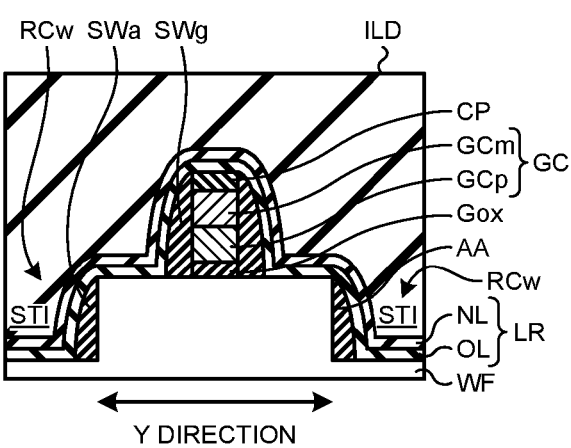
Figure 11C:
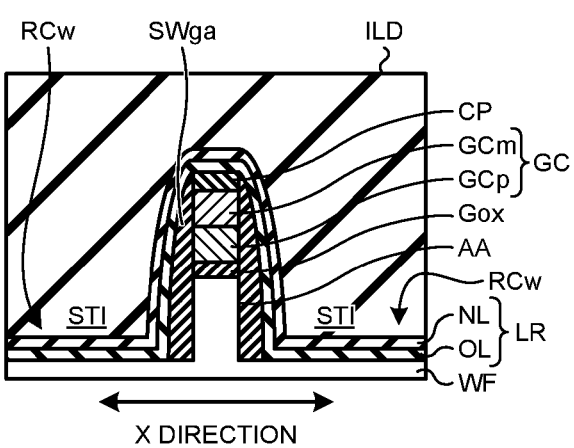

As illustrated in FIGS. 11Ca and 11Cb, the gate electrode GC, the element region AA, and the recesses RCw on both the X-direction side and the Y-direction side of the element region AA are covered with the interlayer insulating layer ILD. The interlayer insulating layer ILD can be formed by supplying the substrate WF with a raw material gas such as polysilazane. In this event, the element separation portion STI is formed by the interlayer insulating layer ILD that covers the recess RCw.

In this way, the transistor TR of the first embodiment is manufactured.

Effect of First Embodiment

As described above, for example, the sense amplifier circuit and the latch circuit for reading the data of the memory cell are currently becoming smaller. As a part of this, the number of tiers, which is the number of sense amplifier circuits arranged in the Y direction, is reduced from, for example, 16 tiers to 12 tiers or 10 tiers, reducing the circuit area thereof. The width of these circuits in the X direction is necessary to be reduced to fit within the pitch of a predetermined number of bit lines to reduce the number of tiers.

As described above, upon forming a transistor, the width of the gate electrode in the X direction is configured to be larger than the width of the element region in consideration of positional deviation between the element region and the gate electrode. In this case, the width of the element region in the X direction is necessary to be reduced in some cases. This is to reduce the width of the transistor in the X direction while maintaining the extent of protrusion of the gate electrode from the element region and the distance between the gate electrodes adjacent to the X direction appropriately.

However, in using the technique mentioned above, the gate width of the gate electrode is small, so the desired current value fails to be obtained due to the narrow channel effect. In addition, depending on the structure of the transistor, a reverse narrow channel effect can occur. In this case, there is a concern that the leakage current will increase, and in particular, there is a large number of sense amplifiers connected to the bit line and data latches connected to the sense amplifier, so there is a concern that the influence of the increase in leakage current will be considerably large. In addition, due to the narrow channel effect and the reverse narrow channel effect, the threshold value is likely to vary even with a small gate width variation, so there is a concern that the threshold value variation due to the influence of the processing variation is large. In addition, the threshold variation between neighboring transistors depending on $1/\sqrt{LW}$ is large, so there is a concern that the stability of operation is hindered. Thus, it is desirable to reduce the size of the transistor by reducing the width of the element separation portion in the X direction instead of the width of the element region.

According to the method of manufacturing the transistor TR of the first embodiment, by pressing the pattern PT of the template TM against the resist layer RS, the convex element region pattern RSpa and the convex gate electrode pattern RSpg arranged on the upper surface of the element region pattern RSpa are transferred to the resist layer RS.

The use of the resist pattern RSp created in this way makes it possible to prevent or reduce the occurrence of positional deviation in the gate electrode GC for the element region AA. Thus, it is possible to eliminate the protruding portion of the gate electrode GC from the element region AA and reduce the distance between the gate electrodes GC adjacent to each other in the X direction. Thus, the reduction in the width of the element separation portion STI in the X direction instead of the width of the element region AA makes it easy to reduce the size of the transistor TR. In other words, it is possible to miniaturize the transistor TR while preventing or reducing the narrow channel effect and the reverse narrow channel effect.

Further, as described above, the use of the imprint technique to manufacture the transistor TR makes it possible to perform the patterning of the element region AA and the gate electrode GC collectively. This makes it possible to reduce the number of processing steps such as lithography, reducing the manufacturing cost.

FIGS. 12A and 12B illustrate configuration examples of a semiconductor storage device of a comparative example and the semiconductor storage device 1 of the first embodiment. FIGS. 12A and 12B are schematic diagrams illustrating an example of the layout of transistors included in semiconductor storage devices according to the first embodiment and a comparative example.

As illustrated in FIG. 12A, a transistor TR' included in the semiconductor storage device of the comparative example has a gate electrode GC' in which both ends in the X direction protrude from an element region AA'. This configuration makes it difficult to sufficiently reduce the width of an element separation portion STI' in the X direction in the transistor TR' of the comparative example.

Further, from the viewpoint of the resolution upon patterning of the gate electrode GC', the distance between the gate electrodes GC' adjacent to each other in the X direction is necessary to be maintained at a predetermined distance or more, which also hinders the reduction in the width of the element separation portion STI'.

As a result, within the pitch of the same 16 bit lines BL, the element region AA' and a gate width W' of the transistor TR' of the comparative example are narrower than that of the transistor TR of the first embodiment illustrated in FIG. 12B.

Moreover, in the manufacturing process of the transistor TR' of the comparative example, the element region AA' is first patterned, and then the gate electrode GC' is patterned. Thus, a recess formed by patterning the element region AA' is filled with an insulating layer separately from the interlayer insulating layer, and for example, the element separation portion STI' is formed prior to the patterning of the gate electrode GC'.

In this way, in the transistor TR' of the comparative example, the transistors TR' in which the same control signal is input to the gate electrode GC' are made adjacent to each other in the X direction, the gate electrode GC' is made to be extended on the element separation portion STI' between the two transistors TR', and both transistors TR' are made to share the gate electrode GC'. This makes the control signal input from a common gate contact CG' to be distributed to both transistors TR'.

Some differences between the transistor TR of the first embodiment and the transistor TR' of the comparative example are described below by considering things described above.

According to the transistor TR of the first embodiment, the upper surface of the element region AA and the gate electrode GC have substantially the same width in the X direction, and the center position of the upper surface of the element region AA and the center position of the gate electrode GC substantially coincide with each other in the X direction. According to the transistor TR' of the comparative example, the gate electrode GC' is made to protrude from the element region AA' in consideration of the positional deviation of the gate electrode GC' for the element region AA', and so it has a configuration different from the above.

According to the transistor TR of the first embodiment, the liner layer LR continuously extends from the gate electrode GC to the element separation portion STI and lies concealed below the element separation portion STI in the element separation portion STI. According to the transistor TR' of the comparative example, the gate electrode GC' and the liner layer are formed after the recesses to be the element separation portion STI' are filled with the insulating layer, and the liner layer is placed on the element separation portion STI', and so it has a configuration different from the above.

Moreover, according to the transistor TR of the first embodiment, the liner layer LR includes, for example, the silicon nitride layer NL. As described above, the liner layer LR contains nitride at least in part thereof, so it is easy to determine that the liner layer LR lies concealed below the element separation portion STI.

According to the transistor TR of the first embodiment, the interlayer insulating layer ILD constitutes the element separation portion STI at both side positions of the convex element region AA in the X direction. According to the transistor TR' of the comparative example, the interlayer insulating layer is formed separately from the insulating layer of the element separation portion STI', so it has a configuration different from the above.

According to the transistor TR of the first embodiment, the sidewalls SWa and SWga covering the side surface of the element region AA are provided. According to the transistor TR' of the comparative example, the gate electrode GC' and the sidewall are formed after the recess serving as the element separation portion STI' is filled with the insulating layer, so the sidewall is not formed on the side surface of the element region AA' and it has a configuration different from the above.

According to the transistor TR of the first embodiment, the gate electrodes GC included individually in the plurality of transistors TR are physically separated from each other. According to the transistor TR' of the comparative example, the element separation portion STI' is formed prior to the patterning of the gate electrode GC', and the gate electrodes GC' to which a common control signal is input are physically connected between a plurality of transistors TR', so it has a configuration different from the above.

(First Modification)

The description is now given of a transistor TRa to be applied to the semiconductor storage device of a first modification of the first embodiment with reference to FIGS. 13A to 14Cb. The transistor TRa as a semiconductor device of the first modification is different from the first embodiment described above in that it includes a reduced element region AAa.

The use of the imprint technique to manufacture transistors enables the widths of the element region and the gate electrode in the X direction to be substantially equal as described above. However, as described above, due to processing variations, in some cases, side etching occurs on the gate electrode GC and the like, or the apex corner portion of the gate electrode GC or the like is likely to be a rounding shape.

In the first modification, in a case where the dimensions of a gate electrode GCa or the like are smaller than the specified value due to the processing variations, it prevents the gate electrode GCa from entering the inside of the element region AAa.

Figure 13A:
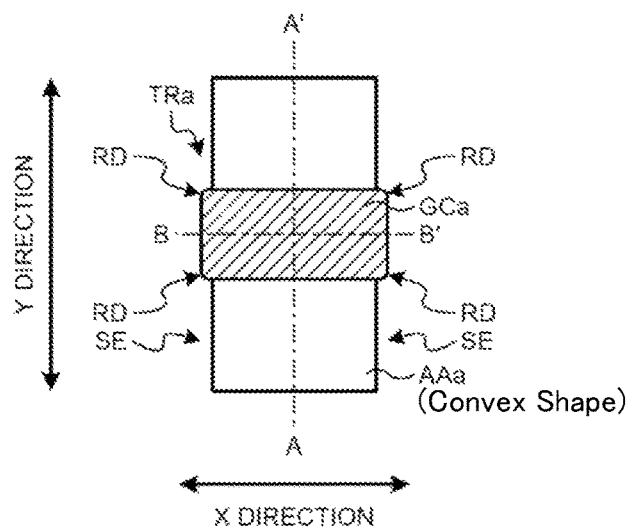
FIGS. 13A to 13C are diagrams illustrating an exemplary configuration of a transistor applied to the semiconductor storage device according to a first modification of the first embodiment.
Figure 13B:
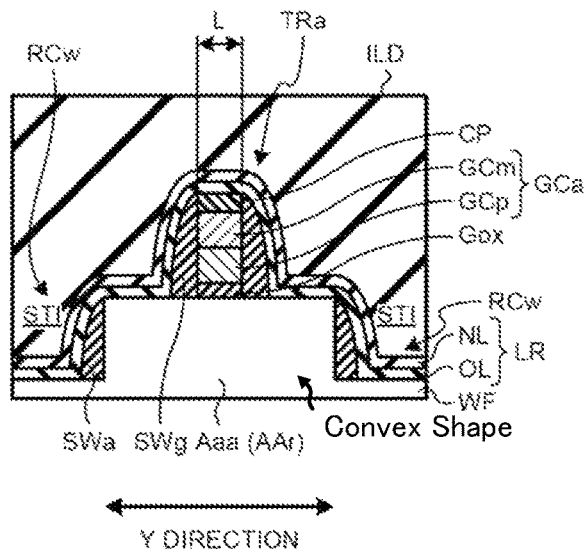
Figure 13C:
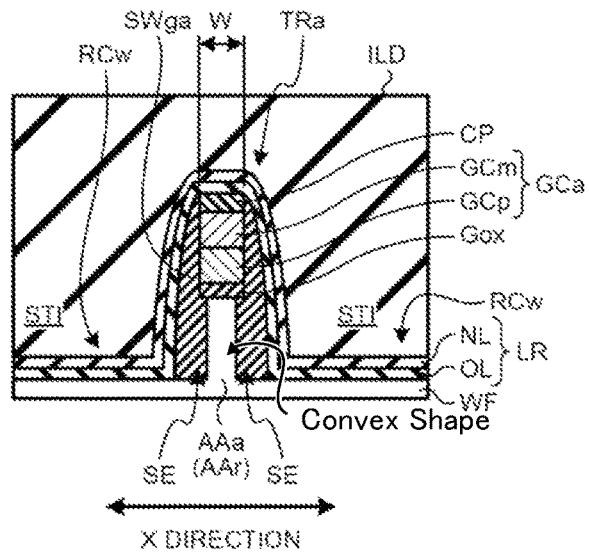

FIGS. 13A to 13C are diagrams illustrating an exemplary configuration of the transistor TRa applied to the semiconductor storage device according to the first modification of the first embodiment. FIG. 13A is a schematic top view illustrating the gate electrode GCa of the transistor TRa and the element region AAa. FIG. 13B is a cross-sectional view of the transistor TRa in the Y direction, that is, the A-A' line of FIG. 13A. FIG. 13C is a cross-sectional view of the transistor TRa in the X direction, that is, the B-B' line of FIG. 13A. Moreover, in FIGS. 13A to 13C, the gate contact and the source/drain contact are omitted. In addition, FIGS. 13A to 13C illustrate an example in which the gate electrode GCa has a rounding-shaped RD.

As illustrated in FIG. 13A, the gate electrode GCa of the transistor TRa is configured, for example, in a rectangular shape in a top view, and four apex corner portions of the gate electrode GCa have the rounding-shaped RD. More specifically, at least one of the poly-gate electrode GCp and the metal-gate electrode GCm included in the gate electrode GCa has a rounding-shaped RD.

Further, the gate electrode GCa has a shape slightly protruding from the element region AAa in the X direction. This is because, as will be described later, the side surface of the element region AAa facing in the X direction is side-etched. As described above, the transistor TRa of the first modification has a width-reduced portion SE on both sides of the element region AAa in the X direction. Thus, the width of the upper surface of the element region AAa in the X direction is narrower than that of the gate electrode GCa. However, even in this case, the positional deviation of the gate electrode GCa for the element region AAa is prevented or reduced, so the center position of the upper surface of the element region AAa and the center position of the gate electrode GCa substantially coincide with each other in the X direction.

The element region AAa has the width slightly narrower than that of the gate electrode GCa, so the rounded portion of the gate electrode GCa is separated from the element region AAa, keeping the gate electrode GCa from entering the inside of the element region AAa.

FIG. 13C illustrates a cross-section of the width-reduced portion SE of the transistor TRa. As illustrated in FIG. 13C, the width is reduced in the X direction, so the element region AAa of the first modification has the width narrower than that of the element region AA of the first embodiment in the X direction as described above.

Further, although it is difficult to distinguish from FIG. 13B, the size of the element region AAa in the Y direction is also smaller than, for example, the size of the element region AA of the first embodiment in the Y direction as described above.

Figure 14A:
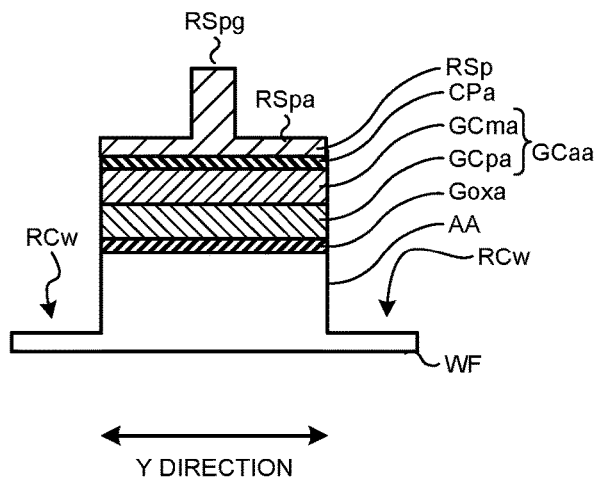
FIGS. 14Aa to 14Cb are diagrams illustrating an example of the procedure of a method of manufacturing the transistor according to the first modification of the first embodiment.
Figure 14A:
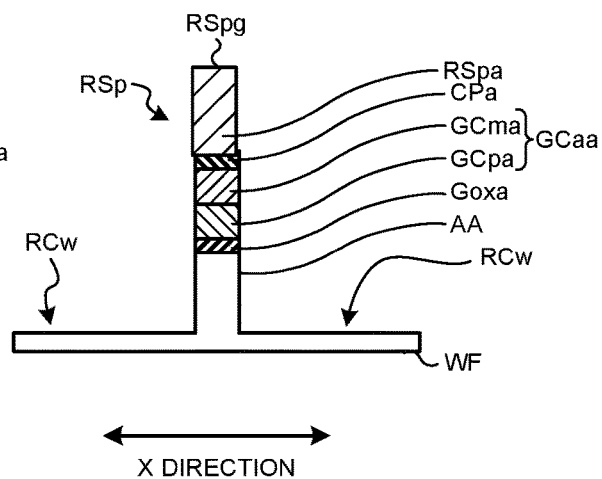

FIGS. 14Aa to 14Cb are diagrams illustrating an example of the procedure of a method of manufacturing the transistor TRa according to the first modification of the first embodiment. In FIGS. 14Aa to 14Cb, the figures in which the lowercase letter "a" is attached to the drawing number are cross-sectional views taken along the Y direction of the substrate WF, and the figures in which the lowercase letter "b" is attached to the drawing number are cross-sectional views taken along the X direction of the substrate WF.

In the manufacturing process of the transistor TRa of the first modification, a manufacturing method similar to that of the transistor TR of the first embodiment described above is employed until the element region AA is formed. FIGS. 14Aa and 14Ab illustrate a state in which the processing of FIGS. 9Ba and 9Bb of the first embodiment described above is completed.

Figure 14B:
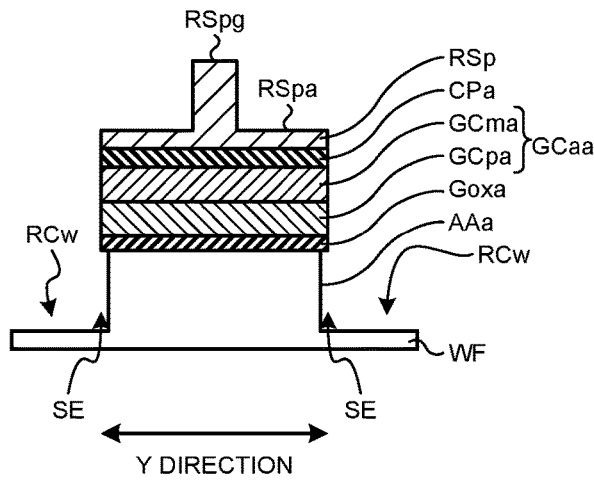
Figure 14B:
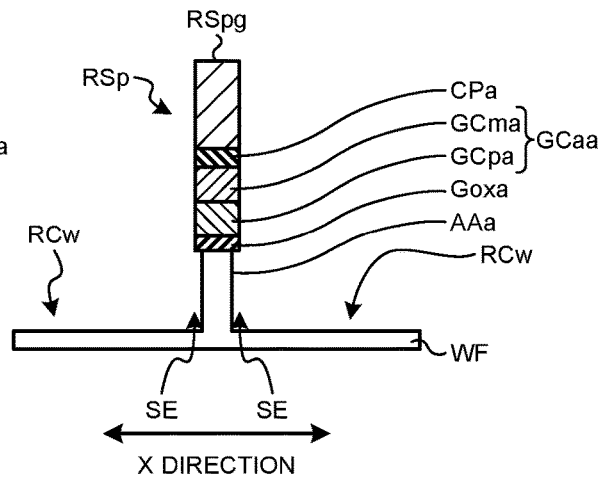

As illustrated in FIGS. 14Ba and 14Bb, the manufacturing process of the transistor TRa of the first modification includes steps of side-etching the side surface of the well AAr to which the element region pattern RSpa is transferred and forming the element region AAa in the X direction having a width narrower than the width of the gate electrode GCa to be formed later.

More specifically, after the element region AA is formed, the side surface of the element region AA is side-etched to form the element region AAa having a width narrower in the X direction and the Y direction than the element region AA. The side surface of the element region AA can be side-etched, for example, by performing the treatment using the RIE technique under conditions where isotropic properties can be obtained.

In this event, processing the element region AA while maintaining the selection ratio with each layer except the well AAr prevents or reduces the side surfaces of the cap layer CPr, the gate electrode layer GCr, and the gate insulating layer Goxr processed into a shape that overlaps the element region AA in the stacking direction of each layer from being side-etched.

Further, before removing the element region pattern RSpa, the element region AA is processed while protecting the upper surface of the cap layer CPa with the element region pattern RSpa, so the processing variation of the gate electrode GCa or the like can be kept to a minimum.

Accordingly, the transistor TRa has the width-reduced portion SE individually on the side surface facing the X direction and the side surface facing the Y direction of the element region AAa. In addition, processing the element region AA makes the bottom surface of the recess RCw slightly to be etched to make the recess RCw slightly deeper.

However, assuming that the bottom surface of the recess RCw is etched, the depth can be adjusted upon forming the recess RCw in such a way that the depth is similar, for example, to that of the recess RCw of the first embodiment.

Figure 14C:
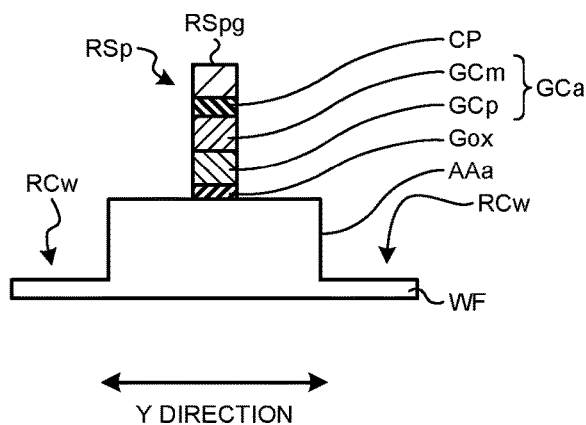
Figure 14C:
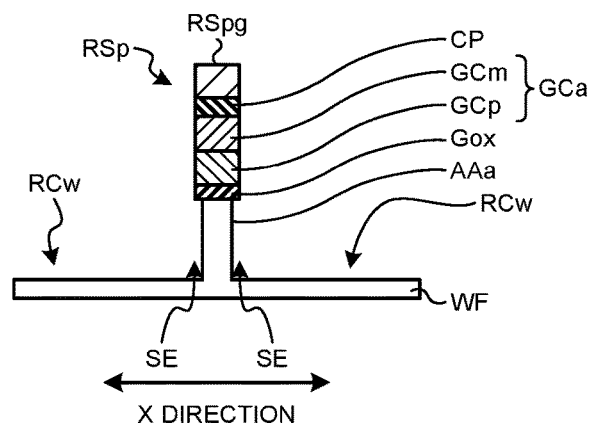

As illustrated in FIGS. 14Ca and 14Cb, after forming the element region AAa, the remaining element region pattern RSpa is removed in a similar way to that of the first embodiment described above, and the cap layer CPa, the metal-gate electrode layer GCma, the poly-gate electrode layer GCpa, and the gate insulating layer Goxa are sequentially processed using the gate electrode pattern RSpg.

Accordingly, the cap layer CP, the gate electrode GCa, and the gate insulating layer Gox are formed above the element region AAa. They have the width in the X direction larger than the width of the element region AA and have the center position in the X direction that substantially coincides with the center position of the element region AAa.

Moreover, the rounding of at least one of the poly-gate electrode GCp and the metal-gate electrode GCm can occur in the patterning process of the element region AA in FIGS. 14Aa and 14Ab. Alternatively, the rounding of at least one of the poly-gate electrode GCp and the metal-gate electrode GCm can occur in the patterning process of the gate electrode GC in FIGS. 14Ca and 14Cb.

Alternatively, the rounding of at least one of the poly-gate electrode GCp and the metal-gate electrode GCm can occur in both the patterning process of the element region AA and the patterning process of the gate electrode GC. At least when the processing of FIGS. 14Ca and 14Cb is completed, the gate electrode GCa has the rounding-shaped RD.

Then, the processing that is similar to that of FIGS. 10Ba and 10Bb of the first embodiment described above is performed.

In this way, the transistor TRa of the first modification is manufactured.

As described above, for example, in some cases, a processing variation exceeding a specified value occurs in the gate electrode, and the gate electrode enters the inside of the element region without completely covering the element region in the X direction.

In one example, in the case where the apex corner portion of the gate electrode enters the inside of the element region because the gate electrode has the rounding shape, it is considered that the electric field that reaches the end of the element region that defines the channel from the gate electrode gets weak. In this case, the controllability of the gate electrode will be lowered, increasing the leakage current. In addition, if the gate electrode has a rounding shape, the gate length of this portion will be shorter than the specified value. This also causes an increase in leakage current.

Further, in one example, in the case where the width of the gate electrode in the X direction is narrower than that of the element region due to side etching or the like occurring in the gate electrode, the control of the gate electrode fails to be effective at the end portion of the element region in the X direction, in some cases. In this case, the constant current will continue to flow through the transistor, failing to function as a transistor.

According to the transistor TRa of the first modification, the width of the upper surface of the element region AAa is narrower than the width of the gate electrode GCa in the X direction. This makes it possible to prevent or reduce the gate electrode GCa from entering the inside of the element region AAa. Thus, the controllability of the gate electrode GCa can be improved, and the gate length can be secured, so it is possible to prevent or reduce the increase in the leakage current in the transistor TRa.

According to the method of manufacturing the transistor TRa of the first modification, the side surface of the well AAr to which the element region pattern is transferred is side-etched to form the element region AAa having a width narrower than the width of the gate electrode GCa in the X direction. Thus, it is possible to easily form the element region AAa having a width narrower than that of the gate electrode GCa on the basis of the gate electrode GCa and the element region AA having substantially the same width in the X direction.

(Second Modification)

Figure 15A:
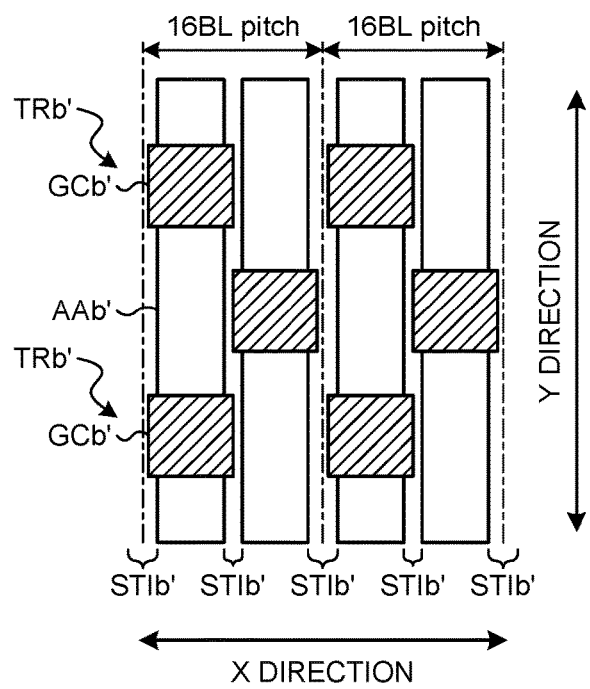
FIGS. 15A and 15B are schematic diagrams illustrating an example of the layout of transistors included in semiconductor storage devices according to a second modification of the first embodiment and the comparative example.
Figure 15B:
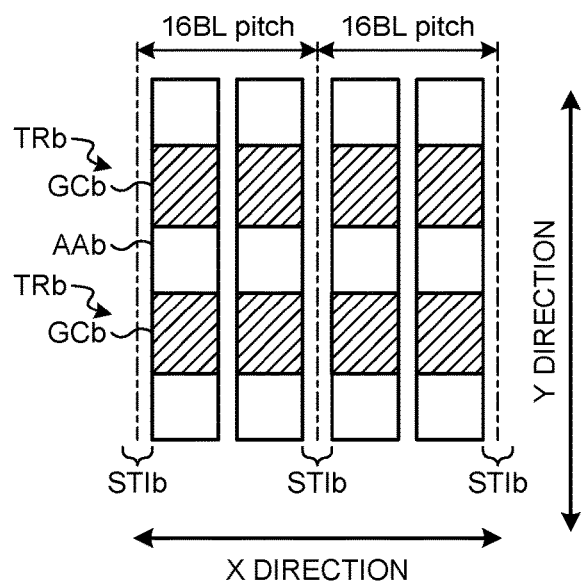

The description is now given of a transistor TRb included in a semiconductor storage device of a second modification of the first embodiment with reference to FIGS. 15A and 15B. In the transistor TRb as a semiconductor device of the second modification, the arrangement form of the transistors TRb arranged in the Y direction is different from that of the first embodiment described above.

Among the peripheral circuits included in the semiconductor storage device 1 of the first embodiment described above, there is room for further reducing the gate width of the transistor TR than the gate width of the transistor TR of the sense amplifier circuit SA in the latch circuits DL and XDL. Thus, in the future, for example, it is conceivable to arrange the transistors of the sense amplifier circuit SA in one row as described above and to arrange a plurality of transistors of the latch circuit within the pitch of a predetermined number of bit lines BL. FIGS. 15A and 15B illustrate an example in which a plurality of transistors of the latch circuit is arranged.

FIGS. 15A and 15B are schematic diagrams illustrating an example of the layout of transistors TRb and TRb' included in semiconductor storage devices according to the second modification of the first embodiment and the comparative example. FIG. 15A is a layout of the transistor TRb' as the comparative example, and FIG. 15B is a layout of the transistor TRb of the second modification. In FIGS. 15A and 15B, the gate contact and source/drain contact connected to the transistors TRb and TRb' are omitted.

As illustrated in FIGS. 15A and 15B, the transistors TRb and TRb' in the respective second modification and comparative example are arranged in a plurality of rows within the pitch of, for example, 16 bit lines BL. The transistors TRb and TRb' are transistors belonging to, for example, a latch circuit, as described above.

As illustrated in FIG. 15A, the transistor TRb' of the comparative example includes a gate electrode GCb' in which both ends in the X direction protrude from an element region AAb'. Thus, to arrange the transistors TRb' of a plurality of rows within the pitch of the 16 bit lines BL while securing the required gate width, the transistors TRb' adjacent in the X direction are arranged in such a way as to deviate in the Y direction of the gate electrode GCb'. In other words, in the plurality of rows of transistors TRb', the gate electrodes GCb' are arranged in a staggered pattern.

However, if the gate electrodes GCb' are arranged in a staggered pattern, the entire arrangement of the transistors TRb' will increase in the Y direction.

As illustrated in FIG. 15B, the transistor TRb of the second modification includes a gate electrode GCb whose width in the X direction is substantially equal to that of an element region AAb. Thus, even if a plurality of rows of transistors TRb is arranged within the pitch of 16 bit lines BL while securing the required gate width, it is possible to align and arrange the positions of the gate electrodes GCb in the Y direction in the transistors TRb adjacent to the X direction. In other words, in the plurality of rows of transistors TRb, it is possible to arrange the gate electrodes GCb in a grid pattern.

The arrangement of the gate electrodes GCb in a grid pattern in this way makes it possible to arrange more transistors TRb at a shorter distance in the Y direction, reducing the size of the arrangement of the transistors TRb in the Y direction.

Second Embodiment

A second embodiment is now described in detail with reference to the drawings. As described below, the configurations of the transistors TR and TRa of the respective first embodiment and first modification described above are also applicable to the transistors of the row decoder 20.
(Configuration of Row Decoder)

Figure 16:
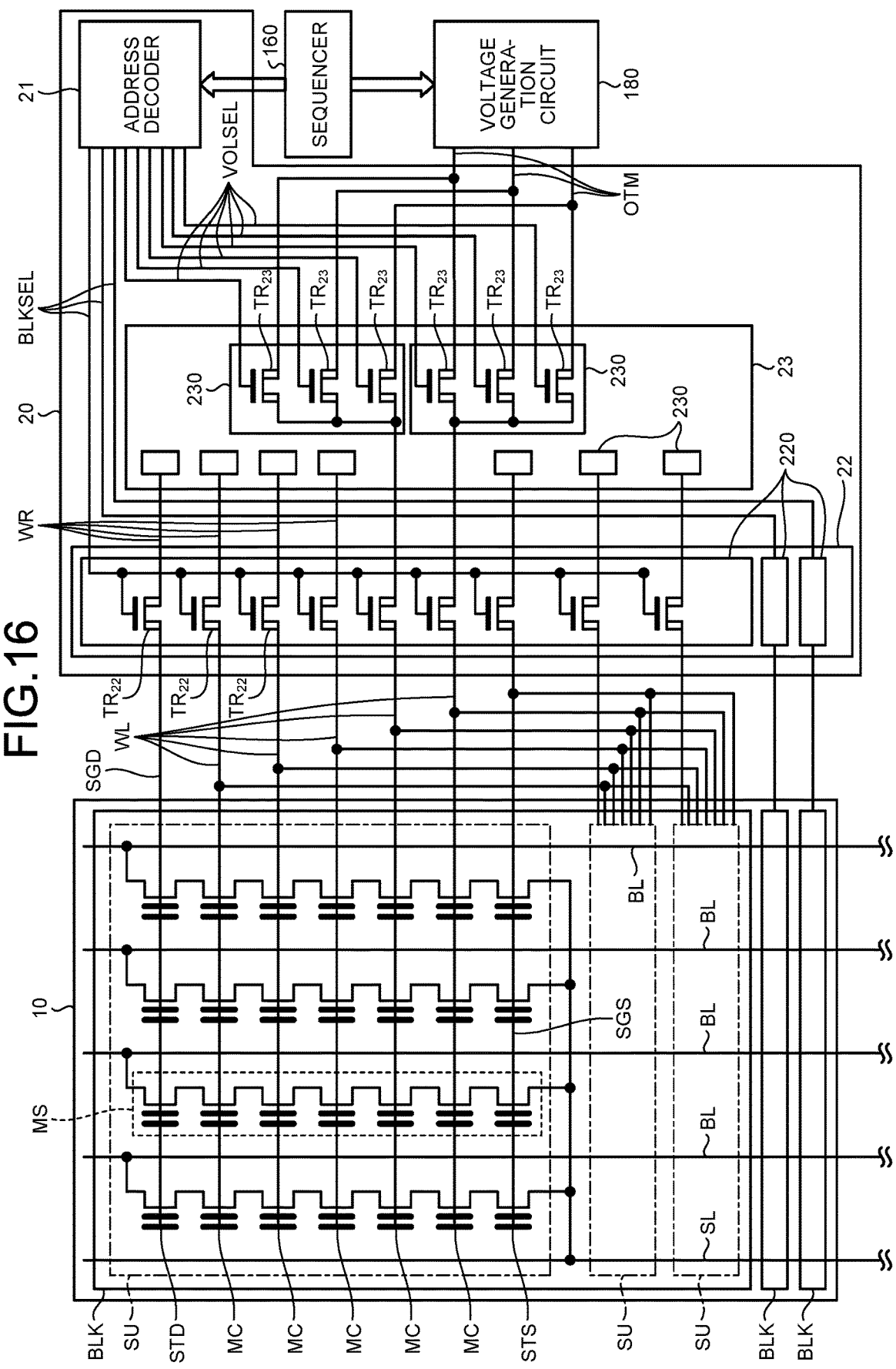
FIG. 16 is a circuit diagram illustrating an exemplary configuration of a row decoder included in a semiconductor storage device according to a second embodiment.

The circuit configuration of a row decoder 20 included in a semiconductor storage device according to the second embodiment is now described with reference to FIG. 16. FIG. 16 is a circuit diagram illustrating an exemplary configuration of a row decoder 20 included in the semiconductor storage device according to the second embodiment.

As illustrated in FIG. 16, the semiconductor storage device of the second embodiment includes a memory cell array 10 configured in a similar way to the semiconductor storage device 1 of the first embodiment. In the second embodiment, a sequencer 160 and a voltage generation circuit 180 are also configured similar way to the first embodiment described above.

The row decoder 20 of the second embodiment includes an address decoder 21, a block selection circuit 22, and a voltage selection circuit 23. Moreover, in terms of circuit configuration, the row decoder 20 can also have the same configuration as the row decoder of the first embodiment described above.

The address decoder 21 includes a plurality of block selection lines BLKSEL and a plurality of voltage selection lines VOLSEL.

The address decoder 21 refers to the address data of the address register (see FIG. 1) included in the peripheral circuit described above in accordance with, for example, a control signal from the sequencer 160.

Further, the address decoder 21 decodes the referenced address data, turns on a transistor $TR_{22}$ and a transistor $TR_{23}$ corresponding to the address data among transistors, and turns off the other transistors $TR_{22}$ and $TR_{23}$. Moreover, the transistors $TR_{22}$ and $TR_{23}$ are transistors included respectively in the block selection circuit 22 and the voltage selection circuit 23 to be described later.

Further, the address decoder 21 sets the voltage of the block selection line BLKSEL and the voltage selection line VOLSEL corresponding to the address data to, for example, the "H" state, and sets the other voltages to the "L" state. Moreover, the voltage to be applied to the lines is reversed depending on whether the block selection circuit 22 and the voltage selection circuit 23 employ an N-channel type or P-channel type transistor. The voltage described above is an example in the case where the transistor is an N-channel type.

In the example of FIG. 16, the address decoder 21 is provided with one block selection line BLKSEL for each block BLK in the memory cell array 10. However, this configuration can be changed as necessary. In one example, one block selection line BLKSEL can be provided for each of two or more block BLKs.

The block selection circuit 22 includes a plurality of block selection units 220 corresponding to the blocks BLK of the memory cell array 10. Each of the plurality of block selection units 220 includes a plurality of transistors $TR_{22}$ corresponding to a word line WL and selection gate lines (SGD and SGS).

The transistor $TR_{22}$ is a high-withstand voltage N-channel MOS transistor and functions as a block drive transistor. The transistor $TR_{22}$ has the drain electrode electrically connected to the corresponding word line WL or selection gate line (SGD or SGS). The transistor $TR_{22}$ has the source electrode electrically connected to a corresponding voltage output terminal OTM via a wiring WR and the voltage selection circuit 23. The transistor $TR_{22}$ has the gate electrode commonly connected to the corresponding block selection line BLKSEL.

Further, the block selection circuit 22 further includes a plurality of transistors (not illustrated). The plurality of transistors is high-withstand voltage CMOS transistors connected between the selection gate line (SGD or SGS) and a ground voltage supply terminal. The plurality of transistors makes the selection gate line (SGD or SGS) included in an unselected block BLK in the memory cell array 10 conductive to the ground voltage supply terminal. Moreover, the plurality of word lines WL included in the unselected block BLK is in a floating state.

The voltage selection circuit 23 includes a plurality of voltage selection units 230 corresponding to the word line WL and the selection gate line (SGD or SGS). Each of the plurality of voltage selection units 230 includes the plurality of transistors $TR_{23}$.

The transistor $TR_{23}$ is a high-withstand voltage N-channel MOS transistor and functions as a voltage selection transistor. The transistor $TR_{23}$ has the drain electrode electrically connected to the corresponding word line WL or selection gate line (SGD or SGS) via the wiring WR and the block selection circuit 22. The source electrode is electrically connected to the corresponding voltage output terminal OTM. The gate electrode is connected to the corresponding voltage selection line VOLSEL.

As described above, the row decoder 20 belonging to the peripheral circuit includes the plurality of transistors $TR_{22}$ and $TR_{23}$, or the like. However, the circuit configuration of the row decoder 20 illustrated in FIG. 16 is an example, and the number and types of transistors $TR_{22}$ and $TR_{23}$ or the like included in the row decoder 20 can be different.

(Configuration of Transistor)

Figure 17A:
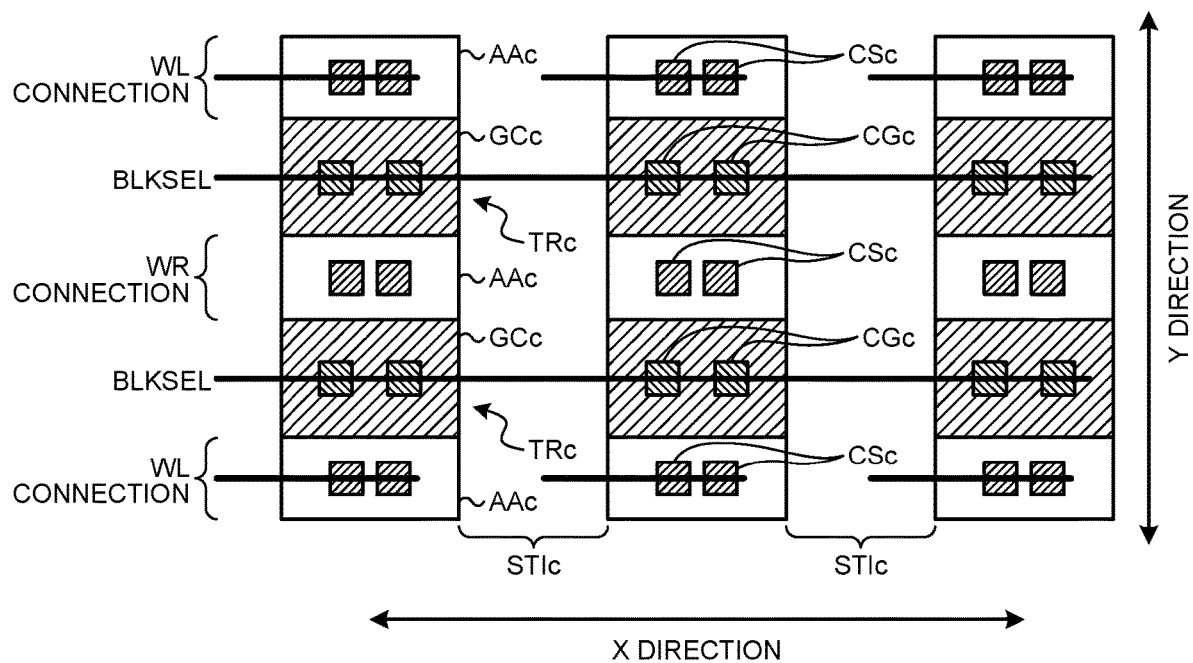
FIGS. 17A and 17B are schematic diagrams illustrating an example of the layout of transistors included in the semiconductor storage device according to the second embodiment.
Figure 17B:
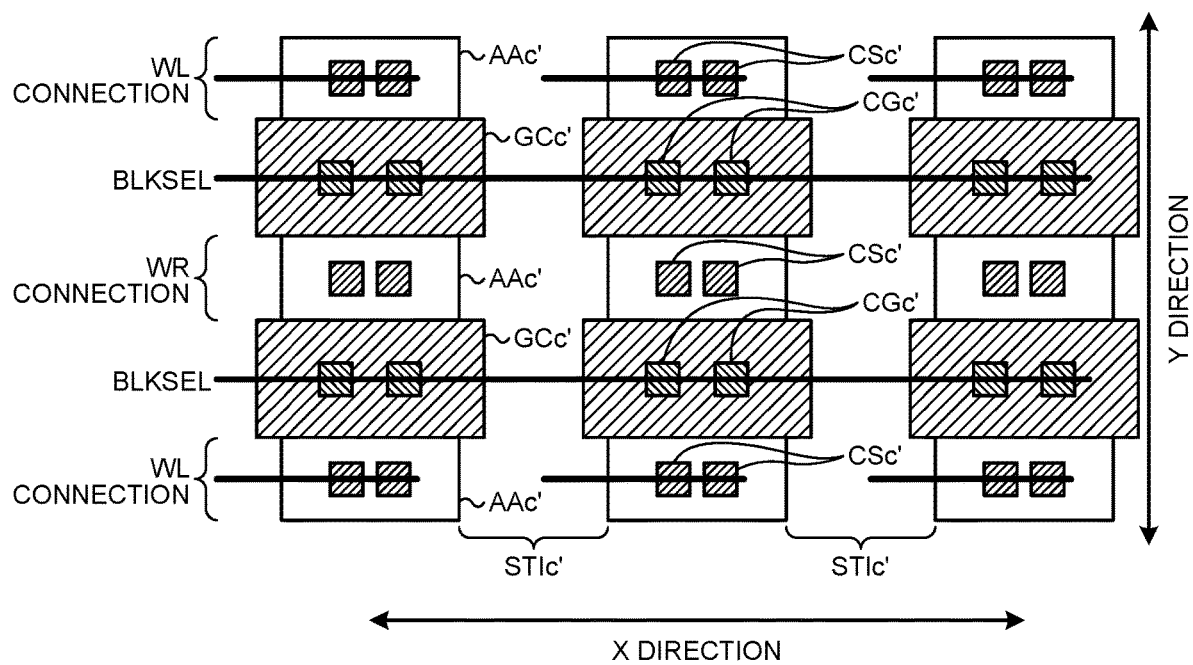

The description is now given of a physical configuration example of the transistor $TR_{22}$ included in the row decoder 20 of the second embodiment with reference to FIGS. 17A and 17B.

FIGS. 17A and 17B are schematic diagrams illustrating an example of the layout of transistors TRc and TRc' included in semiconductor storage devices according to the second embodiment and the comparative example. FIG. 17A is a layout of a transistor TRc as a semiconductor device of the second embodiment, and FIG. 17B is a layout of a transistor TRc' of the comparative example. In these figures, the transistor TRc is included in the block selection circuit 22 of the row decoder 20, and is, for example, the transistor $TR_{22}$ described above that functions as a block drive transistor.

As illustrated in FIG. 17A, the configuration of the transistor TR of the first embodiment described above is applied to the transistor TRc of the second embodiment. In other words, the transistor TRc includes an element region AAc extending in the Y direction and a plurality of gate electrodes GCc arranged on the element region AAc. The plurality of gate electrodes GCc has a width substantially equal to the width of the element region AAc in the X direction. An element separation portion STIc extends in the Y direction between the element regions AAc adjacent to the X direction.

A gate contact CGc is connected to the gate electrode GCc of the transistor TRc. The gate contacts CGc are connected to the respective corresponding block selection lines BLKSEL.

A source/drain contact CSc is connected to the element region AAc of the transistor TRc. The transistors TRc arranged in a row share the source/drain contact CSc with the transistors TRc adjacent to each other in the Y direction. The source/drain contact CSc on the drain electrode side of the transistor TRc is connected to the corresponding word line WL. The source/drain contact CSc on the source electrode side of the transistor TRc is connected to the corresponding voltage selection unit 230 via the wiring WR.

As illustrated in FIG. 17B, the transistor TRc' of the comparative example includes a gate electrode GCc' in which both ends in the X direction protrude from the element region AAc'. Thus, in the transistor TRc', if the width of an element separation portion STIc' in the X direction is not sufficient, the high voltage applied to the gate electrode GCc' is likely to reach the bottom surface of the element separation portion STIc'. In this case, a field inversion leak occurs in the transistor TRc' adjacent in the X direction.

A high voltage of, for example, 30V is applied to the gate electrode GCc', which is a block drive transistor, via the block selection line BLKSEL. Such application of a high voltage to the gate electrode GCc' makes it possible to form an inversion layer on the bottom surface of the element separation portion STIc'. The field inversion leak is a leakage current that flows through the inverting layer to the transistor TRc' adjacent in the X direction.

According to the transistor TRc of the second embodiment, the gate electrode GCc does not have a protruding portion. This makes the high voltage applied to the gate electrode GCc difficult to reach the bottom surface of the element separation portion STIc, so it is possible to prevent or reduce the field inversion leakage. In addition, it is possible to reduce the width of the element separation portion STIc in the X direction while preventing or reducing the field inversion leak. Thus, the size of the block selection circuit 22 can be easily reduced.

Moreover, the transistor $TR_{22}$ included in the block selection circuit 22 of the row decoder 20 can have the configuration of the transistor TRa of the first modification of the first embodiment described above.

Further, the configurations of the transistors TR and TRa of the respective first embodiment and first modification described above can also be applied to other transistors of the row decoder 20. In other words, the transistor $TR_{23}$ included in the voltage selection circuit 23 or the transistors included in the block selection circuit 22 and connected between the selection gate line (SGD or SGS) and the ground voltage supply terminal can also be provided with a gate electrode that does not have the protruding portion described above.

Third Embodiment

A third embodiment is now described in detail with reference to the drawings. As described below, the configurations of the transistors TR and TRa of the respective first embodiment and first modification described above are also applicable to the transistors of the peripheral circuit of the non-volatile memory such as a DRAM, for example.

(Schematic Configuration of Semiconductor Storage Device)

Figure 18:
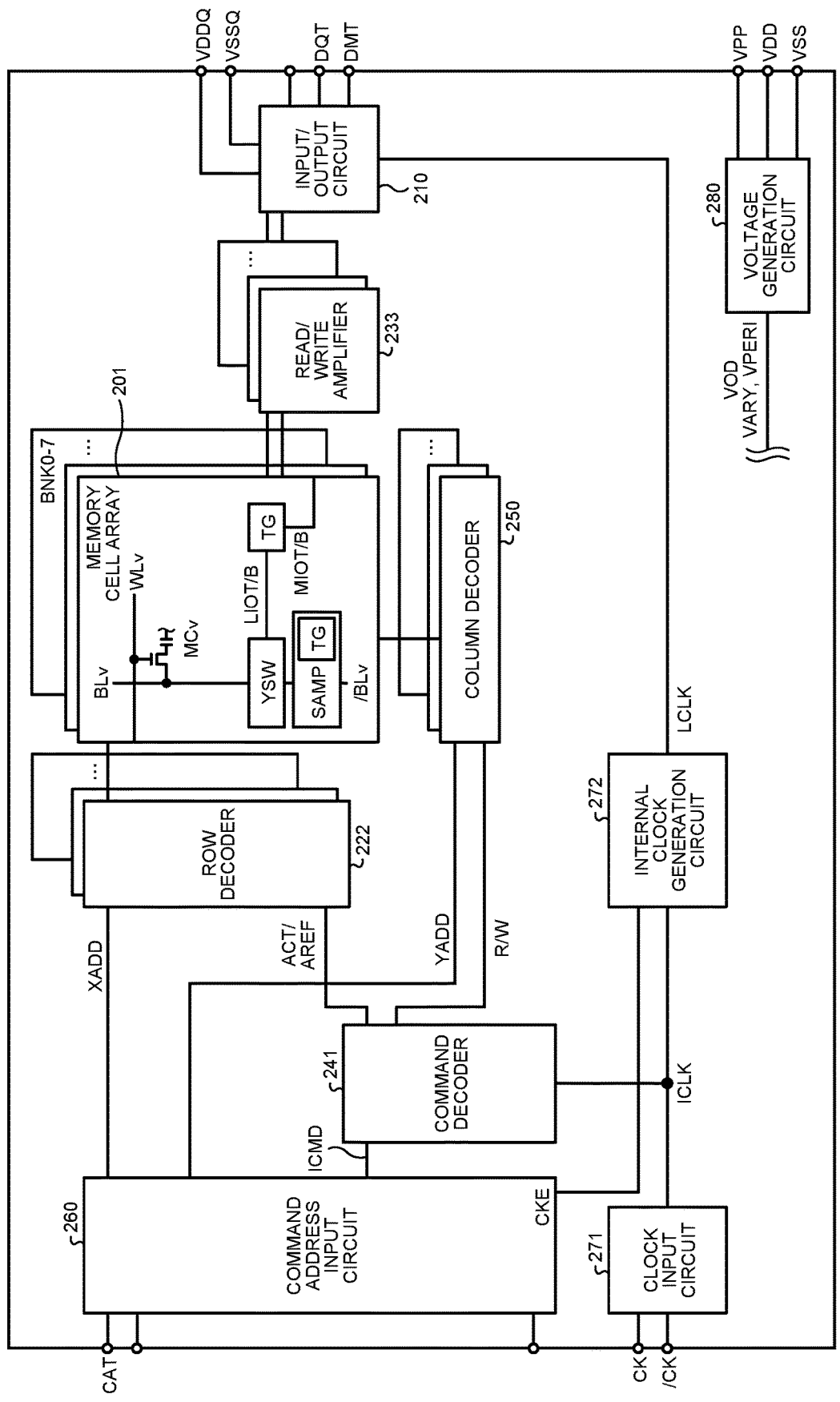
FIG. 18 is a block diagram of a semiconductor storage device according to a third embodiment.

An exemplary configuration of a semiconductor storage device 2 according to the third embodiment is now described with reference to FIG. 18. FIG. 18 is a block diagram of the semiconductor storage device 2 according to the third embodiment.

As illustrated in FIG. 18, the semiconductor storage device 2 of the third embodiment includes peripheral circuits and a plurality of external terminals. The peripheral circuits include, for example, a memory cell array 201, an input/output circuit 210, a row decoder 222, a read/write amplifier 233, a command decoder 241, a column decoder 250, a command address input circuit 260, a clock input circuit 271, an internal clock generation circuit 272, and a voltage generation circuit 280. The external terminals include, for example, clock terminals CK and CK/, a command/address terminal CAT, a data terminal DQT, a data mask terminal DMT, and power supply terminals VPP, VDD, VSS, VDDQ, and VSSQ.

The memory cell array 201 includes a plurality of banks BNK0-7. Each of the plurality of banks BNK0-1 has a plurality of word lines WLv and a plurality of bit lines BLv and /BLv. A memory cell MCv is arranged at an intersection of the word line WLv and the bit lines BLv. The memory cell MCv is configured as, for example, a transistor and holds volatile data. Thus, the data stored in the memory cell array 201 is held by refreshing data periodically. In FIG. 18, the refresh circuit and the like provided in DRAM are omitted for convenience of description.

Such a memory cell MCv enables the semiconductor storage device 2 to be configured as, for example, dynamic random access memory (DRAM). Moreover, the semiconductor storage device 2 can be configured as another volatile memory such as static RAM (SRAM).

A sense amplifier circuit SAMP is arranged corresponding to the bit lines BLv and /BLv. In addition, the sense amplifier circuit SAMP is connected to a local input/output line LIOT or LIOB via a column switch YSW, and is also connected to a main input/output line MIOT or MIOB via a transfer gate TG. The transfer gate TG functions as a switch. The sense amplifier circuit SAMP senses the data read from the memory cell MCv, similarly to the sense amplifier circuit SA (see FIG. 2) of the first embodiment described above.

A memory address is associated with each of the plurality of memory cells MCv in the memory cell array 201. Among the plurality of external terminals, the command/address terminal CAT receives the memory address from an external device such as a memory controller. The memory address received by the command/address terminal CAT is transmitted to the command address input circuit 260. Upon receiving the memory address, the command address input circuit 260 transmits a decoded row address XADD to the row decoder 222 and transmits the decoded column address YADD to the column decoder 250.

Further, the command/address terminal CAT receives a command from, for example, a memory controller. The command received by the command/address terminal CAT is transmitted to the command decoder 241 as an internal command signal ICMD via the command address input circuit 260.

The command decoder 241 includes a circuit, which decodes the internal command ICMD and generates a signal used to execute the internal command. The command decoder 241 transmits, for example, the activated command ACT and the refresh command AREF to the row decoder 222. The row decoder 222 is connected to the word line WLv and selects the word line WLv in accordance with the command ACT and the refresh command AREF received from the command decoder 241.

Further, the command decoder 241 transmits, for example, a read/write command R/W to the column decoder 250. The column decoder 250 is connected to the bit line BLv and selects the bit line BLv in accordance with the read/write command R/W received from the command decoder 241.

Upon reading data, the command/address terminal CAT receives the memory address together with the read command. Thus, data is read from the memory cell MCv in the memory cell array 201 specified by the memory address. The read data is output to the outside from the data terminal DQT via the read/write amplifier 233 and the input/output circuit 210.

Upon writing data, the command/address terminal CAT receives the memory address together with the write command, and the data terminal DQT receives the write data. In addition, a data mask is transmitted to the data mask terminal DMT, if necessary. The write data is transmitted to the memory cell array 201 via the input/output circuit 210 and the read/write amplifier 233. Thus, the write data is written to the memory cell MCv specified by the memory address.

The read/write amplifier 233 includes various latch circuits that temporarily hold the read data and the write data. The read/write amplifier 233 and the sense amplifier circuit SAMP form a configuration corresponding to the sense amplifier module 30 and the data register 40 (see FIG. 1) of the first embodiment described above.

The power supply voltage is supplied to the power supply terminals VDD and VSS, and the power supply voltage is further supplied to the voltage generation circuit 280. The voltage generation circuit 280 generates various internal voltages VPP, VOD, VARY, and VPERI on the basis of the power supply voltage. The internal voltage VPP is mainly used in the row decoder 222, the internal voltages VOD and VARY are mainly used in the sense amplifier circuit SAMP of the memory cell array 201, and the internal voltage VPERI is used in other peripheral circuit blocks.

Further, the power supply voltage is also supplied to the power supply terminals VDDQ and VSSQ, and the power supply voltage is further supplied to the input/output circuit 210. A dedicated power supply voltage is given to the power supply terminals VDDQ and VSSQ in such a way that the power supply noise occurring in the input/output circuit 210 is prevented from propagating to other circuit blocks. Moreover, the power supply voltage supplied to the power supply terminals VDDQ and VSSQ can be the same as the power supply voltage supplied to the power supply terminals VDD and VSS.

A complementary external clock signal is input to the clock terminals CK and/CK. The external clock signal is supplied to the clock input circuit 271. The clock input circuit 271 generates an internal clock signal ICLK. The internal clock signal ICLK is supplied to the internal clock generation circuit 272 and the command decoder 241.

The internal clock generation circuit 272 generates various internal clock signals LCLK upon being enabled by a clock enable CKE from the command address input circuit 260. The internal clock signal LCLK is used to count the timing of various internal operations. In one example, the internal clock signal LCLK is output to the input/output circuit 210. The input/output circuit 210 transmits and receives data through the data terminal DQT by operating on the basis of the internal clock signal LCLK being input.

(Configuration of Sense Amplifier Module)

Figure 19:
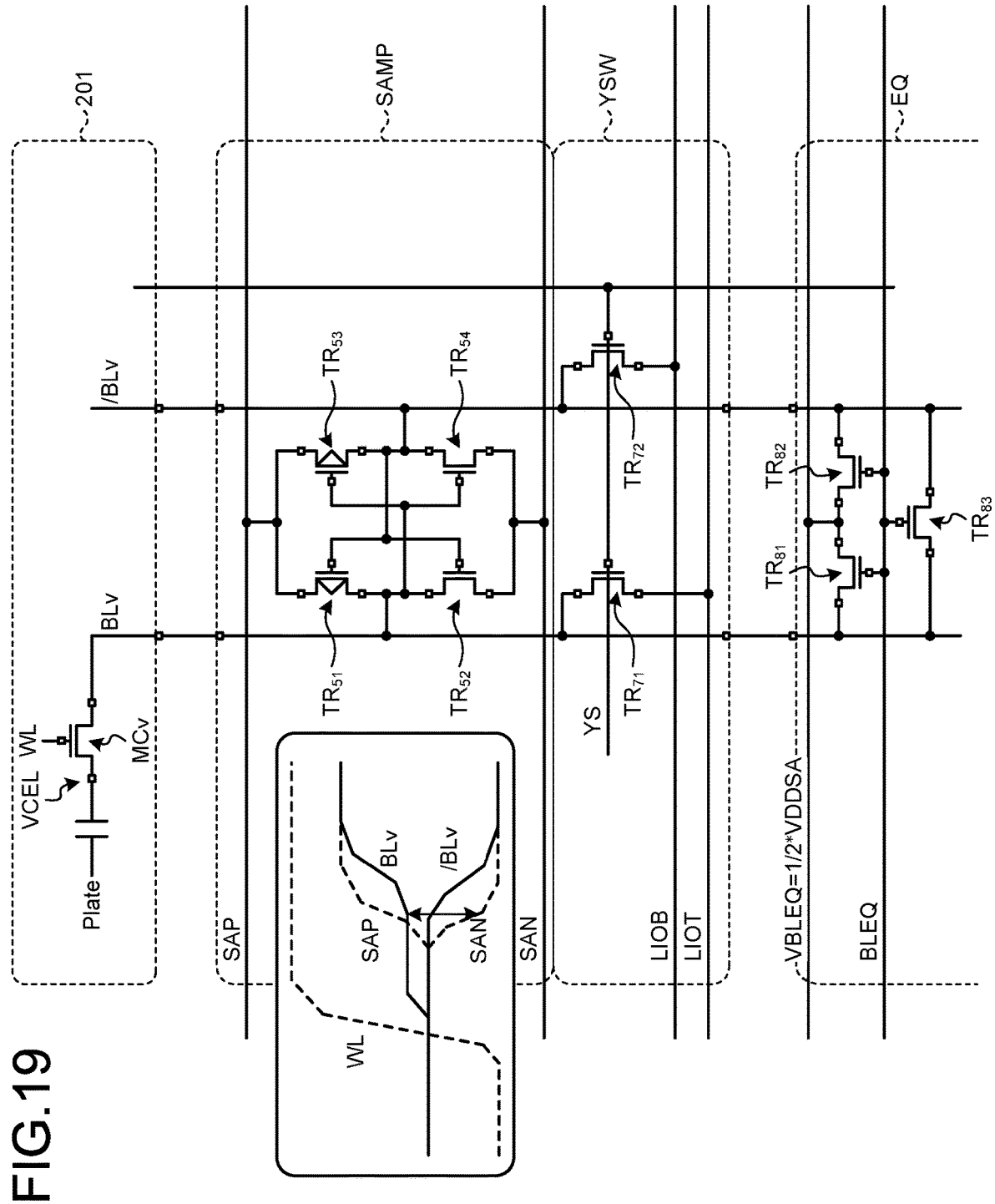
FIG. 19 is a circuit diagram illustrating an example of a circuit configuration provided with a sense amplifier circuit included in the semiconductor storage device according to the third embodiment.

An exemplary configuration of a sense amplifier circuit SAMP included in the semiconductor storage device 2 according to the third embodiment is now described with reference to FIG. 19. FIG. 19 is a circuit diagram illustrating an example of a circuit configuration provided with the sense amplifier circuit SAMP included in the semiconductor storage device 2 according to the third embodiment.

As illustrated in FIG. 19, the bit line BLv connected to the memory cell MCv in the memory cell array 201 and the bit line /BLv paired with the bit line BLv are connected to the sense amplifier circuit SAMP.

The sense amplifier circuit SAMP includes transistors $TR_{51}$ to $TR_{54}$. The transistors $TR_{51}$ and $TR_{53}$ are low-withstand voltage P-channel MOS transistors, and the transistors $TR_{52}$ and $TR_{54}$ are low-withstand voltage N-channel MOS transistors.

The transistor $TR_{51}$ has one end connected to a signal line to which a sense signal SAP is supplied and the other end connected to one end of the transistor $TR_{52}$. The other end of the transistor $TR_{52}$ is connected to a signal line to which a sense signal SAN is supplied. In addition, the bit line BLv is connected between the transistors $TR_{51}$ and $TR_{52}$.

The transistor $TR_{53}$ has one end connected to a signal line to which a sense signal SAP is supplied and the other end connected to one end of the transistor $TR_{54}$. The other end of the transistor $TR_{54}$ is connected to a signal line to which a sense signal SAN is supplied. In addition, the bit line BLv is connected between the transistors $TR_{53}$ and $TR_{54}$.

Further, the gate electrodes of the transistors $TR_{51}$ and $TR_{52}$ are connected between the transistors $TR_{53}$ and $TR_{54}$. The gate electrodes of the transistors $TR_{53}$ and $TR_{54}$ are connected between the transistors $TR_{51}$ and $TR_{52}$.

The column switch YSW is connected to the bit lines BLv and /BLv on the downstream side of the sense amplifier circuit SAMP. The column switch YSW includes transistors $TR_{71}$ and $TR_{72}$. The transistors $TR_{71}$ and $TR_{72}$ are low-withstand voltage N-channel MOS transistors.

The transistor $TR_{71}$ has one end connected to the bit line BLv and the other end connected to the local input/output line LIOB. The transistor $TR_{72}$ has one end connected to the bit line /BLv and the other end connected to the local input/output line LIOT. The gate electrodes of the transistors $TR_{71}$ and $TR_{72}$ are connected to a signal line to which a column selection signal YS is supplied.

The bit lines BLv and /BLv on the downstream side of the column switch YSW are connected to an equalizer circuit EQ.

The equalizer circuit EQ includes transistors $TR_{81}$ to $TR_{83}$. The transistors $TR_{81}$ to $TR_{83}$ are low-withstand voltage N-channel MOS transistors.

The transistor $TR_{81}$ has one end connected to the bit line BLv and the other end connected to the transistor $TR_{82}$. The other end of the transistor $TR_{82}$ is connected to the bit line /BLv. In addition, a power supply line to which an equalization voltage VBLEQ is supplied is connected between the transistors $TR_{81}$ and $TR_{82}$. The magnitude of the equalization voltage VBLEQ is ½ of a power supply voltage VDDSA for the sense amplifier circuit SAMP.

The transistor $TR_{83}$ has one end connected to the bit line BLv and the other end connected to the bit line /BLv.

The gate electrodes of the transistors $TR_{81}$ to $TR_{83}$ are connected to the signal line to which the equalization signal BLEQ is supplied.

The operation of circuits including the sense amplifier circuit SAMP mentioned above is now briefly described.

The equalization signal BLEQ is typically driven to a high level in the steady state. Thus, the transistors $TR_{81}$ to $TR_{83}$ of the equalizer circuit EQ are turned on, and the bit lines BLv and /BLv are equalized to the pre-charge potential.

Subsequently, upon issuing an active command, the equalization is released and the corresponding word line WL is driven to a VPP level on the basis of the input row address XADD. The release of equalization, that is, the inactive state of the equalizer circuit EQ, continues from the issuance of the active command to the issuance of the pre-charge command.

The word line WL is driven to the VPP level and the cell transistor of the corresponding memory cell MCv is turned on, so the cell capacitor of the memory cell MCv is connected to the bit line BLv or the bit line /BLv. Accordingly, the potential of the bit line BLv or the bit line/BLv varies slightly depending on a cell voltage VCEL of the memory cell MCv. The example of FIG. 19 illustrates how the potential of the bit line BLv is slightly increased.

Then, the sense signals SAN and SAP vary to low level and high level, respectively, at a predetermined timing, and the sense amplifier circuit SAMP is activated. Thus, the potential difference between the bit lines BLv and /BLv is amplified. In the example of FIG. 19, the bit line /BL is driven to a low level, and the bit line BL is driven to a high level.

Subsequently, upon issuing the read command, the corresponding column selection signal YS varies to a high level in accordance with the column address YADD input in synchronization with the read command. Before the column selection signal YS is activated, the local input/output lines LIOT and LIOB are pre-charged to the power supply voltage VCC.

When the column selection signal YS is activated, the transistors $TR_{71}$ and $TR_{72}$ of the column switch YSW are turned on, so the bit lines BL and /BL are connected to the corresponding local input/output lines LIOB and LIOT. Thus, the local input/output line LIOB remains at the pre-charge level, and the local input/output line LIOT drops from the pre-charge level to the low level.

In this way, data is read from the memory cell MCv.
(Configuration of Transistor)

Figure 20A:
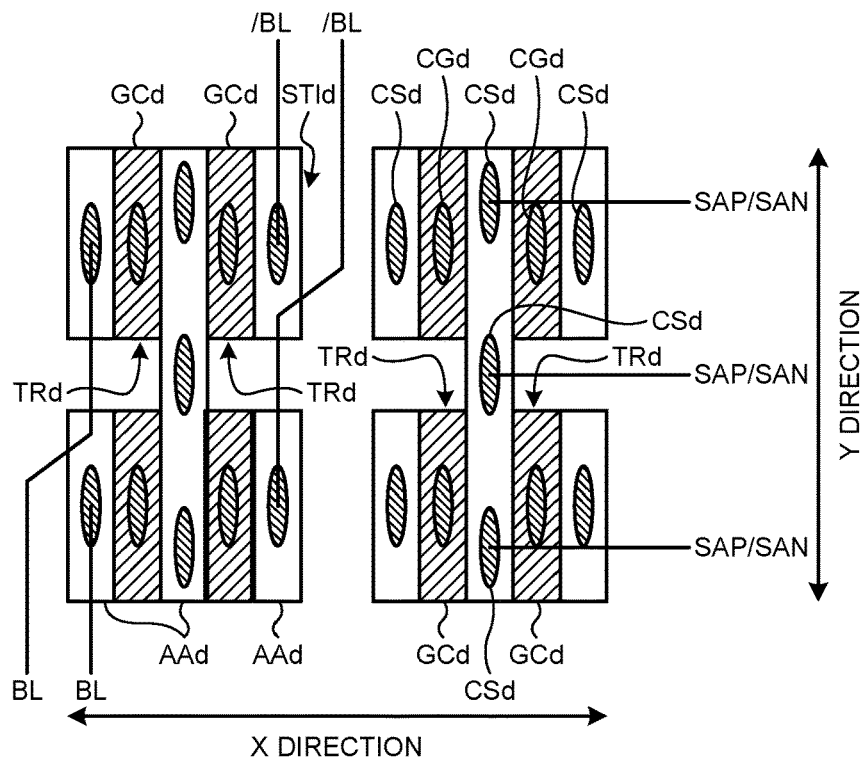
FIGS. 20A and 20B are schematic diagrams illustrating an example of the layout of transistors included in semiconductor storage devices according to the third embodiment and the comparative example.
Figure 20B:
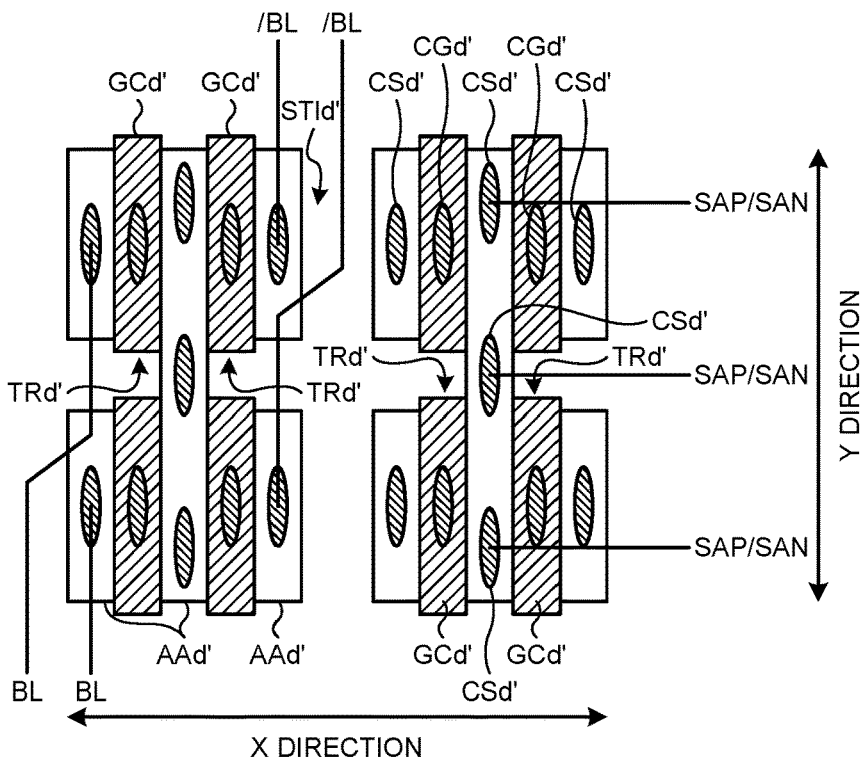

The description is now given of a physical configuration example of the transistor TRd as a semiconductor device included in the sense amplifier circuit SAMP of the third embodiment with reference to FIGS. 20A and 20B.

FIG. 20A is a schematic diagram illustrating an example of the layout of the transistor TRd included in the semiconductor storage device according to the third embodiment, and FIG. 20B is a schematic diagram illustrating an example of the layout of a transistor TRd' of the comparative example.

As illustrated in FIG. 20A, in the sense amplifier circuit SAMP, a plurality of element regions AAd included in each of the plurality of transistors TRd is arranged in a grid shape in the X direction and the Y direction. The plurality of element regions AAd is electrically separated from each other by the element separation portion STId.

A plurality of gate electrodes GCd arranged in the X direction is arranged on each of the element regions AAd. In the example of FIG. 20A, two gate electrodes GCd are arranged on the element region AAd. The element region AAd extends in the Y direction in the region sandwiched between the two gate electrodes GCd and is connected to the adjacent element region AAd.

The configuration of the transistor TR of the first embodiment described above is applied to the transistor TRd of the sense amplifier circuit SAMP of the third embodiment. In other words, in the transistor TRd, the plurality of gate electrodes GCd has a width substantially equal to the width of the element region AAd in the Y direction. That is, even in the transistor TRd of the third embodiment, the plurality of gate electrodes GCd has a gate width substantially equal to the width of the element region AAd in the Y direction.

A gate contact CGd is connected to the gate electrode GCd of the transistor TRd. A source/drain contact CSd is connected to the element region AAd of the transistor TRd. The transistors TRd arranged in the X direction share the source/drain contact CSd with adjacent transistors TRd. The source/drain contact CSd is also arranged at the connecting portion of the element region AAd that is connected to each other in the Y direction.

The source/drain contacts CSd arranged at one end of the transistor TRd on one side in the X direction among the plurality of source/drain contacts CSd are connected to the corresponding bit lines BL. The source/drain contacts CSd arranged at the other end of the transistor TRd on the other side in the X direction are connected to the corresponding bit lines/BL. FIG. 20A illustrates how these bit lines BL and /BL are connected to the transistor TRd belonging to one of the two element regions AAd arranged in the X direction.

The source/drain contact CSd shared by the transistors TRd adjacent to each other in the X direction is commonly connected to a signal line to which the sense signal SAP is supplied or a signal line to which the sense signal SAN is supplied. Specifically, in the case where the transistor TRd is a P-channel MOS transistor, the source/drain contact CSd is connected to the signal line to which the sense signal SAP is supplied. In the case where the transistor TRd is an N-channel MOS transistor, the source/drain contact CSd is connected to the signal line to which the sense signal SAN is supplied.

In connecting the sense signal SAP or SAN to the signal line, the source/drain contact CSd is pulled out to the upper layer and then connected to any of these signal lines extending in the X direction. In other words, these signal lines and the bit lines BL and /BL described above are arranged in a different layer. FIG. 20A illustrates how the signal line of the sense signal SAP or SAN is connected to the transistor TRd belonging to one of the two element regions AAd arranged in the X direction.

As illustrated in FIG. 20B, the transistor TRd' of the comparative example includes a gate electrode GCd' in which both ends in the Y direction protrude from the element region AAd'.

According to the transistor TRd of the third embodiment, the gate electrode GCd does not have a protruding portion. This makes it possible to reduce the area of the transistor TRd. In addition, the reduction in the area of the transistor TRd enables the degree of freedom in design to increase, easily miniaturing the semiconductor storage device 2.

Moreover, the sense amplifier circuit SAMP of the third embodiment can include a transistor to which the configuration of the transistor TRa of the first modification of the first embodiment is applied. In addition, the configuration of the transistor TR of the first embodiment and the first modification described above can be applied to the transistor included in the row decoder 222 of the third embodiment.

In the first to third embodiments described above, the transistors TR and TRa to TRd are arranged on the substrate WF such as a silicon substrate. However, the substrate WF is not necessarily a semiconductor substrate, and the transistors TR and TRa to TRd can be configured to include a semiconductor layer separately formed on the substrate WF. In this case, the element regions AA and AAa to AAd of the transistors TR and TRa to TRd are provided on the semiconductor layer.

NOTES

Hereinafter, preferred embodiments of the present invention will be noted.
(Note 1)
According to one aspect of the present invention, there is provided
a semiconductor device including:
a semiconductor layer;
an element region provided on the semiconductor layer convexly, having a predetermined width in a first direction along a surface of the semiconductor layer, and extending in a second direction along the surface of the semiconductor layer and intersecting the first direction; and
a gate electrode arranged above the element region, wherein the gate electrode and an upper surface of the element region have a substantially equal width in the first direction, and
a center position of the gate electrode in the first direction and a center position of the upper surface of the element region in the first direction substantially coincide with each other in the first direction.
(Note 1)
The semiconductor device according to note 1,
wherein an element separation portion extends in the second direction on both sides of the element region in the first direction, and
further comprising a liner layer covering the gate electrode, and lying below the element separation portion continuously from a surface of the gate electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
a semiconductor layer;
an element region provided on the semiconductor layer convexly, having a predetermined width in a first direction along a surface of the semiconductor layer, and extending in a second direction along the surface of the semiconductor layer and intersecting the first direction;
at least one gate electrode arranged above the element region;
a liner layer covering the at least one gate electrode; and
an element separation portion electrically separates the element region from another element region above which another gate electrode is arranged and extends in the second direction on both sides of the element region in the first direction,
wherein
the liner layer continuously extends from the at least one gate electrode to the element separation portion, and the liner layer in the element separation portion lies below the element separation portion, and
when viewed from a third direction perpendicular to the surface of the semiconductor layer, a boundary of the at least one gate electrode along the second direction being inside a boundary of the element region along the second direction.

2. The semiconductor device according to claim 1, wherein
the at least one gate electrode is covered with an interlayer insulating layer, and
the interlayer insulating layer constitutes the element separation portion at positions on the both sides of the element region in the first direction.

3. The semiconductor device according to claim 1, wherein
a center position of an upper surface of the element region in the first direction and a center position of the at least one gate electrode in the first direction coincide with each other in the first direction.

4. The semiconductor device according to claim 3, wherein
the at least one gate electrode and the upper surface of the element region have an equal width in the first direction.

5. The semiconductor device according to claim 3, wherein
an end position of the at least one gate electrode in the first direction and an end position of the element region in the first direction overlap when viewed from the third direction.

6. The semiconductor device according to claim 1, further comprising:
a first sidewall covering a side surface of the at least one gate electrode; and
a second sidewall covering a side surface of the element region.

7. The semiconductor device according to claim 1, wherein
the liner layer includes nitride, at least in a part of the liner layer in a thickness direction.

8. The semiconductor device according to claim 1, wherein
the at least one gate electrode is one of a plurality of gate electrodes arranged in the second direction.

9. A semiconductor storage device, comprising:
a memory cell array including a plurality of memory cells; and
a peripheral circuit configured to drive the plurality of memory cells,
wherein
the peripheral circuit includes a plurality of transistors, the plurality of transistors each including:
a semiconductor layer;
an element region provided electrically separates the element region from another element region above which another gate electrode is arranged and on the semiconductor layer convexly, having a predetermined width in a first direction along a surface of the semiconductor layer, and extending in a second direction along the surface of the semiconductor layer and intersecting the first direction;
a gate electrode arranged above the element region;
a liner layer covering the gate electrode; and
an element separation portion extends in the second direction on both sides of the element region in the first direction, and
the liner layer continuously extends from the gate electrode to the element separation portion, and the liner layer in the element separation portion lies below the element separation portion, and
an outer shape of the gate electrode being within an outer shape of the element region viewed from a stacking direction of the element region and the gate electrode.

10. The semiconductor storage device according to claim 9, wherein
the peripheral circuit has a sense amplifier circuit including the plurality of transistors.

11. The semiconductor storage device according to claim 9, wherein
the peripheral circuit has a latch circuit including the plurality of transistors.

12. The semiconductor storage device according to claim 9, wherein
the peripheral circuit has a block selection circuit including the plurality of transistors.

13. The semiconductor storage device according to claim 9, wherein
the plurality of transistors includes a first transistor and second transistor adjacent each other in the first direction, and
the gate electrode of the first transistor and the gate electrode of the second transistor are electrically connected to each other via a contact and wiring and are physically separated from each other.

14. The semiconductor storage device according to claim 9, wherein
the memory cell holds non-volatile data.

15. The semiconductor storage device according to claim 9, wherein
the memory cell holds volatile data.

16. A method of manufacturing a semiconductor device, the method comprising:
forming a gate electrode layer and a mask layer above a semiconductor layer sequentially;
creating a mask pattern by transferring an element region pattern and a gate electrode pattern to the mask layer by pressing a pattern of a template against the mask layer, the element region pattern having a predetermined width in a first direction along a surface of the semiconductor layer and extending in a second direction intersecting the first direction along the surface of the semiconductor layer convexly, the gate electrode pattern being arranged on an upper surface of the element region pattern convexly, and when viewed from a third direction perpendicular to the surface of the semiconductor layer, a boundary of the gate electrode pattern along the second direction being inside a boundary of the element region pattern along the second direction;
forming an element region having a predetermined width in the first direction and extending in the second direction convexly by transferring the element region pattern to the gate electrode layer and the semiconductor layer using the mask pattern;
forming a gate electrode arranged above the element region by transferring the gate electrode pattern to the gate electrode layer using the mask pattern;
forming a liner layer covering the gate electrode, the element region and the surface of the semiconductor layer on both sides of the element region in the first direction; and
forming an element separation portion covering the gate electrode, the element region, and the liner layer,
wherein
the element separation portion electrically separates the element region from another element region above which another gate electrode is arranged and extends in the second direction on both sides of the element region in the first direction.

17. The method according to claim 16 wherein
the surface of the semiconductor layer having a recessed part by forming the element region convexly; and
the element separation portion covers the recessed part of the surface of the semiconductor layer on the both sides of the element region in the first direction.

18. The method according to claim 16, wherein
the forming the element region includes
forming the element region to have a width narrower than a width of the gate electrode in the first direction by side-etching the semiconductor layer to which the element region pattern is transferred.

* * * * *